United States Patent
Posser et al.

(10) Patent No.: US 10,460,064 B1
(45) Date of Patent: Oct. 29, 2019

(54) PARTITION-AWARE GRID GRAPH BASED HIERARCHICAL GLOBAL ROUTING

(71) Applicant: Cadence Design Systems, Inc., San Jose, CA (US)

(72) Inventors: Gracieli Posser, Austin, TX (US); Wen-Hao Liu, Cedar Park, TX (US); Mehmet Can Yildiz, Austin, TX (US); Zhuo Li, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 203 days.

(21) Appl. No.: 15/649,415

(22) Filed: Jul. 13, 2017

(51) Int. Cl.
*G06F 17/50* (2006.01)

(52) U.S. Cl.
CPC ...... *G06F 17/5077* (2013.01); *G06F 17/5072* (2013.01); *G06F 17/5081* (2013.01)

(58) Field of Classification Search
USPC ........................................................ 716/131
See application file for complete search history.

(56) References Cited

U.S. PATENT DOCUMENTS

2007/0028201 A1* 2/2007 Mehrotra ............ G06F 17/5077 716/129

* cited by examiner

*Primary Examiner* — Eric D Lee
(74) *Attorney, Agent, or Firm* — Schwegman Lundberg & Woessner, P.A.

(57) ABSTRACT

Aspects of the present disclosure address improved systems and methods of partition-aware grid graph based routing for integrated circuit designs. Consistent with some embodiments, a method may include accessing a design layout that defines a layout of components of an integrated circuit design, and includes one or more partitions. The method may further include building a uniform grid graph by superimposing a uniform grid structure over the design layout and inserting additional grid lines into the grid structure such that each partition boundary is aligned with a grid line. The method may further include removing redundant grid lines from the non-uniform grid graph resulting from inserting the additional grid lines, the result of which is the partition-aware grid graph. The method further includes using the partition-aware grid graph to route the integrated circuit design.

20 Claims, 17 Drawing Sheets

US 10,460,064 B1

PARTITION-AWARE GRID GRAPH BASED HIERARCHICAL GLOBAL ROUTING

TECHNICAL FIELD

The present disclosure generally relates to the technical field of integrated circuit design. In particular, the present disclosure addresses systems and methods for global routing of integrated circuit designs using a non-uniform grid.

BACKGROUND

An integrated circuit (IC) comprises cells of similar and/or various sizes, and connections between the cells. A cell includes several pins interconnected by wires to pins of one or more other cells. A net includes a set of pins connected by wires in order to form connections between the pins. A set of nets, called a netlist, defines the connections of an IC. In other words, a netlist specifies a group of nets, which, in turn, specify the required interconnections between a set of pins.

Design engineers design IC's by transforming circuit description of the IC's into geometric descriptions, called layouts. To create layouts, design engineers typically use electronic design automation ("EDA") applications. These applications provide sets of computer-based tools for creating, editing, and analyzing design layouts.

EDA applications create layouts by using geometric shapes that represent different materials and devices on IC's. For instance, EDA tools commonly use rectangular lines to represent the wire segments that interconnect the IC components. These tools also represent electronic and circuit IC components as geometric objects with varying shapes and sizes.

The IC design process entails various operations. Some of the physical-design operations that EDA applications commonly perform to obtain the IC layouts are: (1) circuit partitioning, which partitions a circuit if the circuit is too large for a single chip; (2) floor planning, which finds the alignment and relative orientation of the circuit modules; (3) placement, which determines more precisely the positions of the circuit components; (4) routing, which completes the interconnects between the circuit components; and (5) verification, which checks the layout to ensure that it meets design and functional requirements.

Routing is a key operation in the physical design cycle. It is generally divided into two phases: global routing and detailed routing. For each net, global routing generates a routing topology that includes an approximate routing path for the interconnect lines that are to connect the pins of the net. After the routing topology has been created, the detailed routing creates specific individual routing paths for each net.

However, due to the large number of nets in the netlist, it typically takes a long time for conventional routers to finish the connection task. In addition, the connections may be too numerous and/or overcrowded, such that conventional routers fail to finish the routing, particularly generating interconnections, without creating design rule violations. Many of these problems result from the strict adherence of routers to a grid representation of nodes with a uniform structure from layer to layer. Such routers demand excessive amounts of memory and/or take a very long time to route the IC design.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

As noted above, conventional routers employ a grid representation of IC designs in routing. With such grid-based routing, a routing grid graph is superimposed on the routing region during global routing, and the detailed router finds routing paths within the grid graph. Typically, such routers use a uniform grid graph where each cell of the grid graph (also referred to as "GCells") are of the same uniform size. However, in many instances, IC designs may include a number of unroutable regions that correspond to independently designed sub-circuits or subsystems known as "partitions" that are designed to speed up the design process by minimizing the number of interconnections. One of ordinary skill in the art may also refer to these regions as "blocks," "random logic macros," or simply as "macros." When an IC design has partitions, some of the GCells may include portions of partitions, which are typically unroutable, as well as portions of the design that are routable. In these instances, the global router will see capacity on that GCell due to inclusion of the routable regions, and as such, it will consider the entire GCell as routable. The global router will, accordingly, route wires through those GCells, which, in turn, signals the detailed router to place wires over a partition (e.g., macros, power domains, blockages, Interface Logic Model, IPs, or sub chips), which results in a routing violation with respect to preferred region constraints.

Aspects of the present disclosure address the forgoing problem, among others, by utilizing a non-uniform, partition-aware grid graph for global routing, thereby reducing or eliminating preferred region constraint violations during detailed routing. Consistent with some embodiments, systems and methods for building a partition-aware grid graph for hierarchical global routing. The system initially builds a uniform grid graph where each GCell has the same uniform dimensions. The system may then insert additional grid lines into the uniform grid graph that align with partition boundaries. The system may further remove redundant grid lines from the grid graph. As a result, the system produces a non-uniform grid graph having grid lines that align with partition boundaries.

Figure 1:
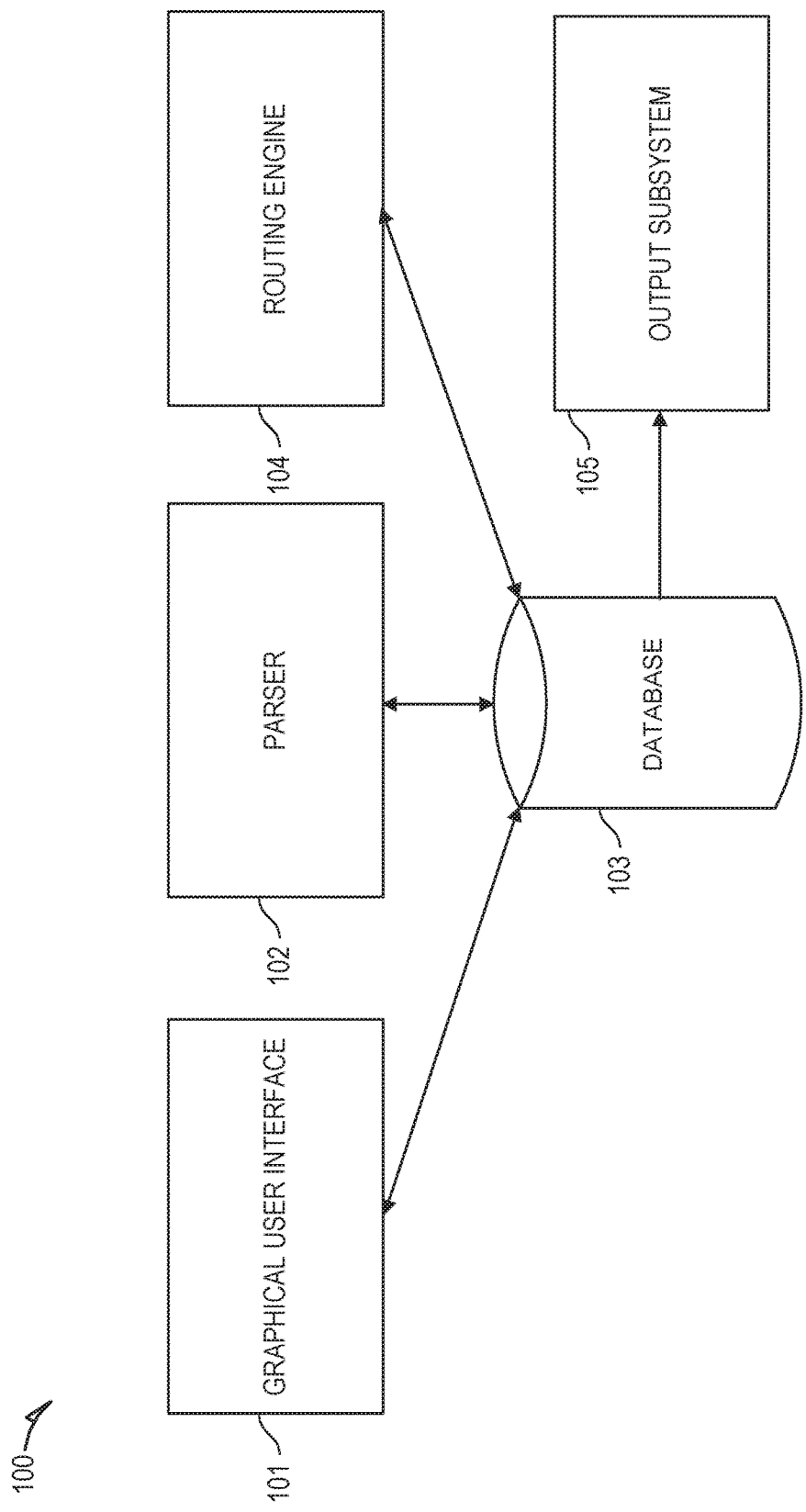
FIG. 1 is a block diagram illustrating a router system, according to some example embodiments.

With reference to FIG. 1, a router 100 is illustrated, according to some example embodiments. The router 100 comprises: a graphical user interface (GUI) 101; a parser 102; a database 103; a routing engine 104; and an output subsystem 105. Any one or more of the functional components illustrated in FIG. 1 and described herein may be implemented using hardware (e.g., a processor of a machine) or a combination of hardware and software. For example, any one of the components described herein may configure a processor to perform the operations described herein for that component. Moreover, any two or more of these components may be combined into a single component, and the functions described herein for a single component may be subdivided among multiple components. Furthermore, according to various example embodiments, any of the functional components illustrated in FIG. 1 may be implemented together or separately within a single machine, database, or device or may be distributed across multiple machines, databases, or devices.

The GUI 101 is responsible for handling user interactions with the router 100. For example, the GUI 101 may allow a user to view wires generated by the router 100. The GUI 101 may also allow the user to view various information, such as routing tracks. The GUI 101 may also allow the user to interactively add and delete wires.

The parser 102 reads in IC design information stored in a format, such as an industry standard format and/or custom format. The cells and connections are entirely or partly described in the files. Once some embodiments of the present invention finish routing, the generated wires will be output into the files as well. The database 103 stores the IC design information as well as wires in a compact and efficient manner. The routing engine 104 generates wires (which are then stored in the database 103) that interconnect the nets of an IC design in accordance with the netlist of the IC design. The output subsystem 105 outputs the wiring and other useful information into files of standard and/or custom format.

Figure 2:
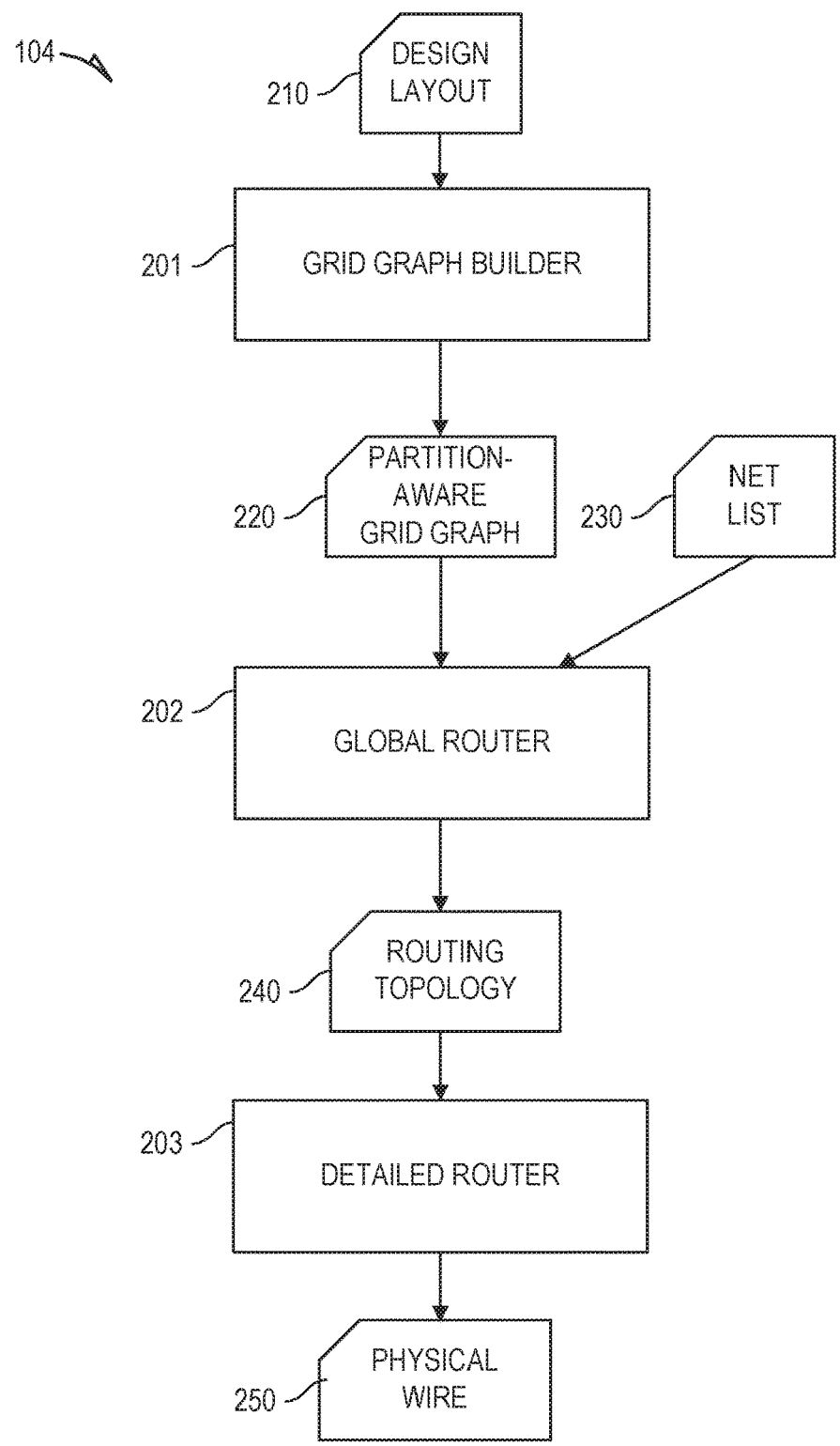
FIG. 2 is a block diagram illustrating functional components of a routing engine, which is provided as part of the router system, according to some example embodiments.

Referring now to FIG. 2, functional components of the routing engine 104 are illustrated, in accordance with some embodiments. To avoid obscuring the inventive subject matter with unnecessary detail, various functional components (e.g., modules, engines, and databases) that are not germane to conveying an understanding of the inventive subject matter have been omitted from FIG. 2. However, a skilled artisan will readily recognize that various additional functional components may be supported by the routing engine 104 to facilitate additional functionality that is not specifically described herein.

Further, any one or more of the functional components illustrated in FIG. 2 and described herein may be implemented using hardware (e.g., a processor of a machine) or a combination of hardware and software. For example, any one of the components described herein may configure a processor to perform the operations described herein for that component. Moreover, any two or more of these components may be combined into a single component, and the functions described herein for a single component may be subdivided among multiple components. Additionally, according to various example embodiments, any of the functional components illustrated in FIG. 2 may be implemented together or separately within a single machine, database, or device or may be distributed across multiple machines, databases, or devices.

As shown, the routing engine 104 comprises a grid graph builder 201, a global router 202 and a detailed router 203. The grid graph builder 201 receives a design layout 210 as input and uses the design layout 210 to produce a partition-aware grid graph 220. The design layout 210 defines a layout of components of an integrated circuit design. More specifically, the design layout 210 provides a representation of an integrated circuit in terms of planar geometric shapes that correspond to the components of the integrated circuit. The design layout 210 may include or be divided into one or more regions, which are smaller functional sub-blocks of the design that are separated out to improve run-time performance of the routing process. The partition-aware grid graph 220 includes a non-uniform grid structure used to represent approximate routing paths to interconnect components in the design layout 210.

Figure 3:
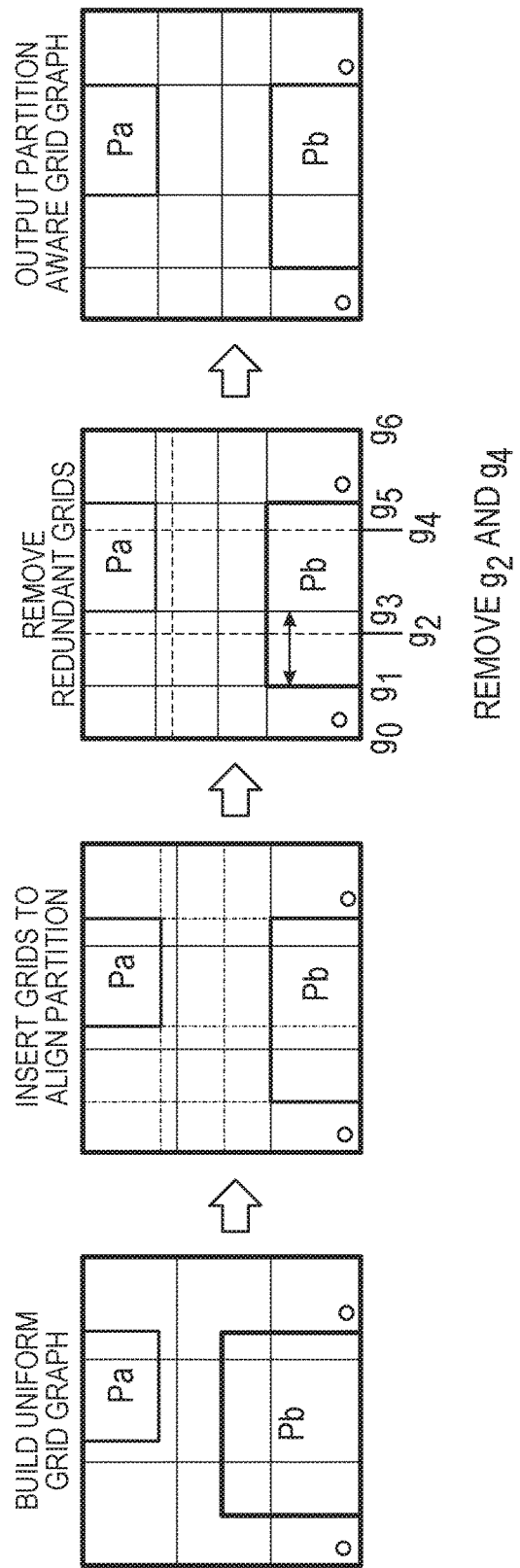
FIG. 3 is a conceptual diagram illustrating a high level overview of a partition-aware grid graph building method performed by a grid graph builder, which is included as part of the routing engine, according to some example embodiments.
Figure 4:
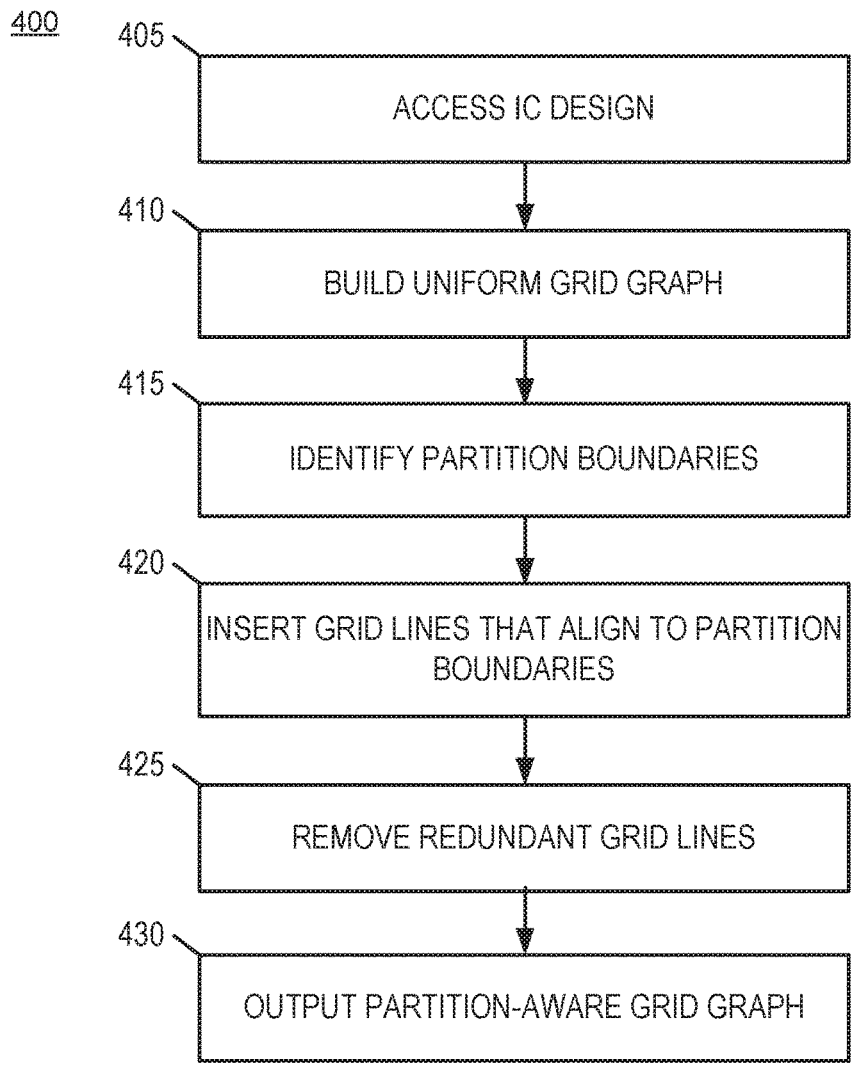
FIGS. 4-9 are flowcharts illustrating operations of the routing engine in performing a method for building a partition-aware grid graph, according to some example embodiments.

As an example, FIG. 3 illustrates a high level overview of a method performed by the grid graph builder 201 in building the partition-aware grid graph 220, which is included as part of the routing engine 104, according to some example embodiments. As shown, the grid graph builder 201 initially builds a uniform grid graph by superimposing perpendicular vertical and horizontal grid lines over the design layout 210 to form a uniform grid structure where each GCell is of uniform dimensions (e.g, each GCell has the same dimensions). As shown in the uniform grid graph illustrated in FIG. 3, at least some GCells include a portion of a partition along with portions of the design layout 210 that do not correspond to a partition, which, without further modification, may lead to region-aware routing constraint violations during detailed routing.

To remedy this issue, the grid graph builder 201 inserts additional horizontal and vertical grid lines that align with partition boundaries. More specifically, grid lines are inserted such that each partition boundary (e.g., both horizontal and vertical boundaries) has an aligned grid line. The result of the addition of grid lines that align to the partition boundaries is a non-uniform grid graph (e.g., not all GCells are of uniform size).

The grid graph builder 201 then removes redundant grid lines from the non-uniform grid graph. The grid graph builder 201 determines that certain grid lines are redundant based on a distance between the grid line and neighboring grid lines. As a more specific example, FIG. 3 illustrates grid line g2 being removed based on a distance between the neighboring grid lines g1 and g3 being below a predefined threshold distance. Similarly, FIG. 3 illustrates grid line g4 being removed based on a distance between the neighboring grid lines g3 and g5 being below the predefined threshold distance. The result of the grid graph builder 201 removing the redundant grid lines is the partition-aware grid graph 220, which is output to the global router 202. In instances in which the design layout 210 includes multiple layers with the same partition configurations, the grid graph builder 201 may construct the partition-aware grid graph 220 for all layers in the design layout 210. In instances in which the design layout 210 includes multiple layers with different partition configurations, the grid graph builder 201 may construct a partition-aware grid graph 220 for each of the layers.

Returning back to FIG. 2, the global router 202 is responsible for determining an approximate routing path for wires connecting each net in accordance with a design netlist 230 in a process referred to by those of ordinary skill in the art as "global routing." In doing so, the global router 202 utilizes the partition-aware grid graph 220 to identify the approximate routing paths in the design layout 210. At any one moment, only a portion, such as an area of one or more partitions, of the design may be routed; therefore much less memory and run time are required. In addition, since the routing task has been divided, multi-threaded parallelism can be applied to speed up the global router 202.

As shown, the global router 202 receives the partition-aware grid graph 220 and a design netlist 230 as input. The global router 202 processes the design netlist 230 using the partition-aware grid graph 220 to generate a routing topology 240 that includes a topological route for each net in the IC design that connects the net's routable elements. For example, each topological route may include multiple connections, each of which represents a wire that connects two pins. To generate the routing topology 240, the global router 202 will check GCell capacity and demand to connect those pins avoiding congestion (e.g., if a GCell has more demand then capacity, the global router 202 will try to avoid putting a new wire on that GCell and it will choose a GCell with less demand). The global router 202 may employ one of many known shortest path algorithms such as Maze routing or A* search, to select the path where demand is smaller than capacity.

The routing topology 240 is passed to the detailed router 203, which generates physical wires 250 that realize the routing topology 240. To generate the physical wires 250 that realize the routing topology 240, the detailed router 203 routes the complete design by dividing the entire design into a set of smaller areas and/or regions. Consistent with some embodiments, the detailed router 203 can route these areas in parallel utilizing multi-threaded parallel computing capabilities. In other embodiments, the detailed routing can be single-threaded all or some of the time, and/or multi-threaded all or some of the time.

It shall be appreciated that, although the grid graph builder 201 is illustrated in FIG. 2 as being separate and distinct from the global router 202, in some embodiments, the grid graph builder 201 may be incorporated into the global router 202 such that the grid graph builder 201 forms part of the global router 202 and the process of building the partition-aware grid graph 220 is part of the global routing process.

FIGS. 4-9 are flowcharts illustrating operations of the routing engine 104 in performing a method 400 for building a partition-aware grid graph (e.g., a partition-aware grid graph 220), according to some example embodiments. The method 400 may be embodied in computer-readable instructions for execution by one or more processors such that the operations of the method 400 may be performed in part or in whole by the routing engine 104; accordingly, the method 400 is described below by way of example with reference thereto. However, it shall be appreciated that at least some of the operations of the method 400 may be deployed on various other hardware configurations, and the method 400 is not intended to be limited to the routing engine 104.

At operation 405, the grid graph builder 201 accesses the design layout 210. As noted above, the design layout 210 defines a layout of components in an integrated circuit. In the design layout 210, circuit components are represented by planar geometric shapes. The design layout 210 may include one or more partitions.

At operation 410, the grid graph builder 201 builds a uniform grid graph by superimposing a uniform grid structure over the design layout. In building the uniform grid graph, grid graph builder 201 inserts perpendicular vertical and horizontal grid lines at uniform distances from one another to create a plurality of GCells that have uniform dimensions (e.g., all GCells have the same dimensions).

At operation 415, the grid graph builder 201 identifies boundaries of each of the one or more partitions included in the design layout 210. That is, the grid graph builder 201 analyzes the design layout 210 to identify a location of each horizontal and vertical boundary of each partition included in the design layout 210.

At operation 420, the grid graph builder 201 inserts one or more additional grid lines into the grid structure that align with the identified partition boundaries. More specifically, the grid graph builder 201 may add horizontal and vertical grid lines to the grid structure such that each of the identified partition boundaries is aligned to a grid line. The result of inserting the additional grid lines to the uniform grid structure is a non-uniform grid graph having GCells of various (e.g., non-uniform) dimensions. Further details regarding the insertion of additional grid lines are discussed below in reference to FIG. 5-7.

At operation 425, the grid graph builder 201 removes one or more redundant grid lines from the non-uniform grid graph, which results in the partition-aware grid graph 220. The grid lines removed by the grid graph builder 201 are redundant grid lines that do not align with partition boundaries. In removing redundant grid lines, the graph builder 201 may identify a grid line as being redundant based on a distance between a preceding grid line (e.g., the grid line immediately to the left of a vertical grid line or the grid line immediately below a horizontal grid line) and a succeeding grid line (e.g., the grid line immediately to the right of the vertical grid line or the grid line immediately above the horizontal grid line). Consistent with some embodiments, the grid graph builder 201 may identify a grid line as being redundant based on the distance between preceding and succeeding grid lines being below a predefined threshold distance. The predefined threshold distance may, for example, be specified by the user via the GUI 101 or may be a default value.

At operation 430, the grid graph builder 201 outputs the partition-aware grid graph 220 to the global router 202 for use in routing the IC design in accordance with the design netlist 230. In some embodiments, rather than providing the partition-aware grid-graph 220 directly to the global router 202, the grid graph-builder 201 may store the partition-aware grid graph 220 in an intermediate storage device (e.g., the grid graph builder 201 may store the partition-aware grid graph 220 in the database 103) for subsequent retrieval by the global router 202.

Figure 5:
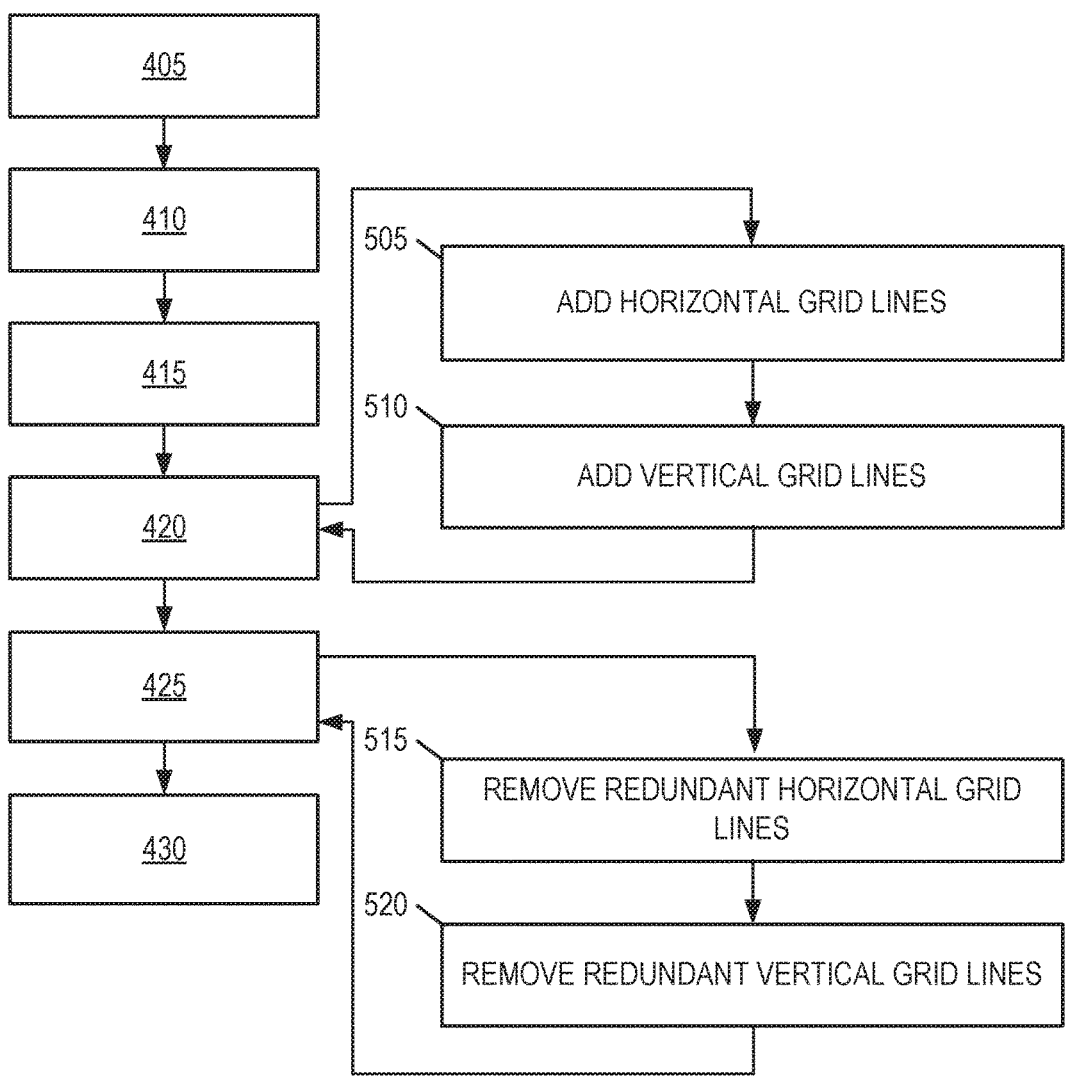

As shown in FIG. 5, the method 400 may, in some embodiments, include operations 505, 510, 515, and 520. In some example embodiments, the operations 505 and 510 included in the method 400 may be performed as part of operation 420 (e.g., as a subroutine or sub-operation), where the grid graph builder 201 inserts one or more additional grid lines into the uniform grid graph.

At operation 505, the grid graph builder 201 adds additional horizontal grid lines in the grid structure that align to horizontal boundaries of the one or more partitions in the design layout 210. The grid graph builder 201 adds the additional horizontal grid lines such that each horizontal boundary of each of the one or more partitions is aligned with a grid line. Further details regarding operation 505 are discussed below in reference to FIG. 6, consistent with some embodiments.

At operation 510, the grid graph builder 201 adds additional vertical grid lines in the grid structure that align to vertical boundaries of the one or more partitions in the design layout 210. The grid graph builder 201 adds the additional vertical grid lines such that each vertical boundary of each of the one or more partitions is aligned with a grid line. Further details regarding operation 510 are discussed below in reference to FIG. 7, consistent with some embodiments.

In some example embodiments, the operations 515 and 520 included in the method 400 may be performed as part of operation 425 (e.g., a subroutine or sub-operation), where the grid graph builder 201 removes one or more redundant grid lines from the non-uniform grid graph. At operation 515, the grid graph builder 201 removes one or more redundant horizontal grid lines from the grid structure. The grid graph builder 201 may determine a horizontal grid line is redundant based on a distance between the grid lines immediately above and below the horizontal grid being below a predefined distance threshold. Further details regarding operation 515 are discussed below in reference to FIG. 8.

At operation 520, the grid graph builder 201 removes one or more redundant vertical grid lines from the non-uniform grid graph. The grid graph builder 201 may determine a vertical grid line is redundant based on a distance between the grid lines immediately to the left and the right of the vertical grid line being below a predefined distance threshold. Further details regarding operation 515 are discussed below in reference to FIG. 9.

Figure 6:
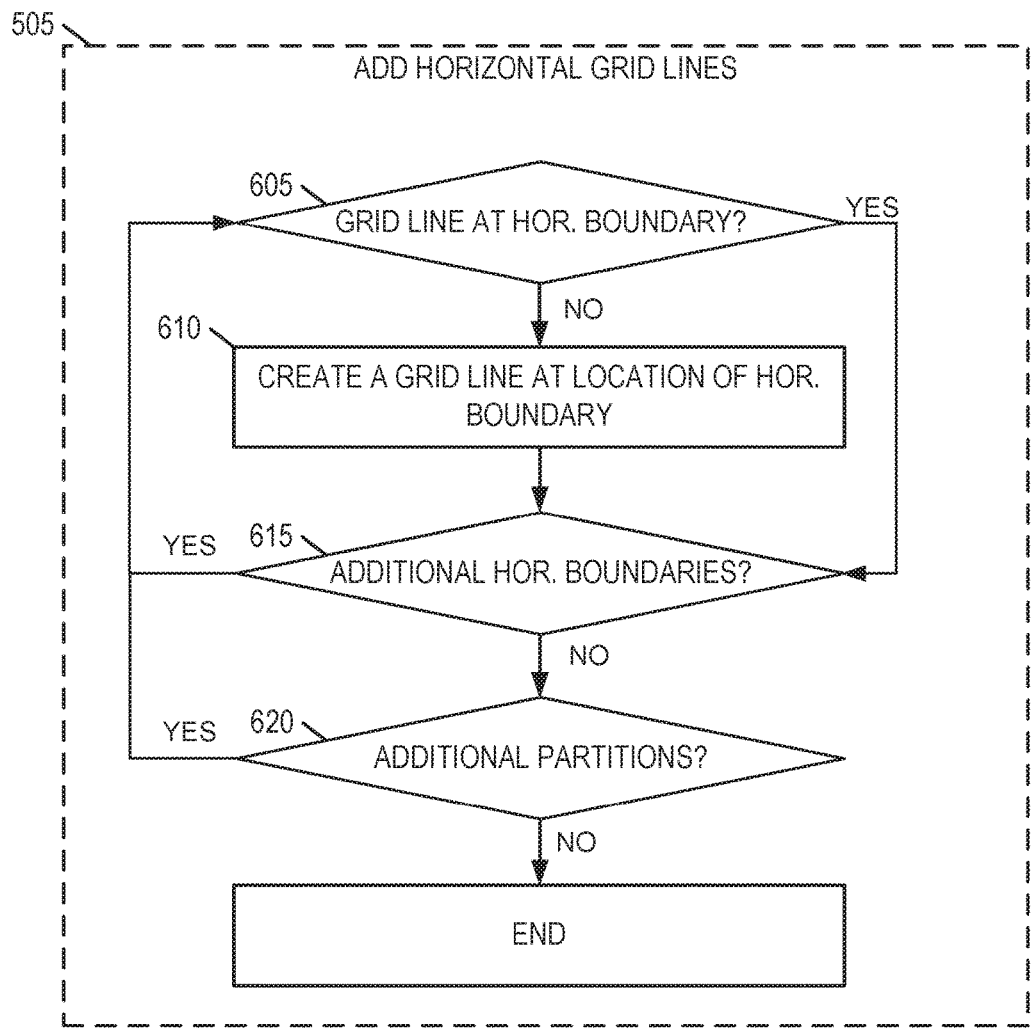

As shown in FIG. 6, the operation 505 of the method 400, where the grid graph builder 201 adds additional horizontal grid lines that align with horizontal boundaries of the one or more partitions in the design layout 210, may include operations 605, 610, 615, and 620. Consistent with some embodiments, in performing operations 605, 610, 615, and 620, the grid graph builder 201 may iterate through each identified horizontal partition boundary in the design layout 210 from bottom to top, beginning with the bottom-most horizontal boundary of the bottom-most partition. However, it shall be appreciated that in adding additional horizontal grid lines, the grid graph builder 201 is not limited to a bottom to top approach, and in other embodiments, the grid graph builder 201 may add additional horizontal grid lines in a top to bottom approach.

In the context of operations 605, 610, 615, and 620, references to relative positions of horizontal boundaries (e.g., "bottom-most") correspond to positions of such boundaries within a coordinate system where positions of objects may be described with a set of Cartesian coordinates (e.g., x, y coordinates). For example, the "bottom-most" horizontal boundary of the bottom-most partition refers to the horizontal partition boundary having the lowest y-coordinate value.

At operation 605, the grid graph builder 201 determines whether the current horizontal partition boundary is aligned with a horizontal grid line. As noted above, initially the "current" horizontal partition boundary is the bottom-most horizontal partition boundary, but as the grid graph builder 201 iterates through operations 605, 610, 615, and 620, the grid graph builder 201 processes each identified partition boundary while traversing the identified horizontal partition boundaries from bottom to top.

Responsive to a determination that the current horizontal partition boundary does not align with a horizontal grid line, the grid graph builder 201, at operation 610, creates a horizontal grid line to the grid structure at the location of the horizontal partition boundary.

Responsive to a determination that the current horizontal partition boundary does align with a horizontal grid line or upon creating the horizontal grid line, the grid graph builder 201, at operation 615, determines whether the current partition includes additional horizontal boundaries. Responsive to a determination that the current partition does include at least one additional horizontal boundary, the grid graph builder 201 returns to operation 605, where the next horizontal partition boundary (e.g., the horizontal partition boundary immediately above the current partition boundary) becomes the current partition boundary for the purposes of operation 605.

Responsive to a determination that the current partition does not include additional horizontal boundaries, the grid graph builder 201, at operation 620, determines whether the design layout 210 includes additional partitions. Responsive to a determination that the design layout 210 includes at least one additional partition, the grid graph builder 201 returns to operation 605, where the next partition (e.g., the partition immediately above the current partition) becomes the current partition, and the bottom-most horizontal partition boundary of that partition becomes the current partition boundary for the purposes of operation 605. Responsive to a determination that the design layout 210 does not include additional partitions, the operation 505 terminates, and the method 400 proceeds to operation 510.

Figure 7:
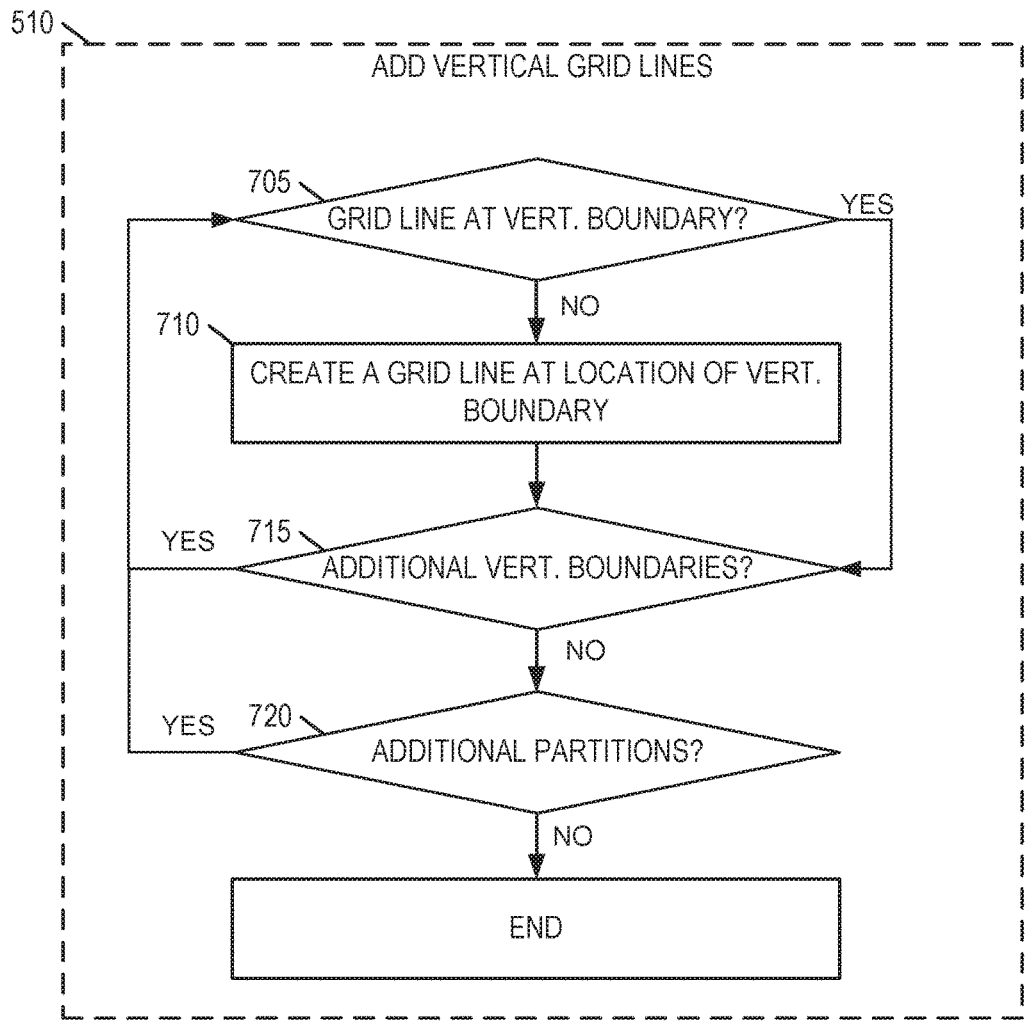

As shown in FIG. 7, the operation 510 of the method 400, where the grid graph builder 201 adds additional vertical grid lines that align with vertical boundaries of the one or more partitions in the design layout 210, may include operations 705, 710, 715, and 720. Consistent with some embodiments, in performing operations 705, 710, 715, and 720, the grid graph builder 201 iterates through each identified vertical partition boundary in the design layout 210 from left to right, beginning with the left-most vertical boundary of the left-most partition. However, it shall be appreciated that in adding additional vertical grid lines, the grid graph builder 201 is not limited to a left to right approach, and in other embodiments, the grid graph builder 201 may add additional vertical grid lines in a right to left approach.

In the context of operations 705, 710, 715, and 720, references to relative positions of vertical boundaries (e.g., "left-most") correspond to positions of such boundaries within a coordinate system where positions of objects may be described with a set of Cartesian coordinates (e.g., x, y coordinates). For example, the "left-most" vertical boundary of the left-most partition refers to the vertical partition boundary having the lowest x-coordinate value of partition related grids.

At operation 705, the grid graph builder 201 determines whether the current vertical partition boundary is aligned with a vertical grid line. As noted above, initially the "current" vertical partition boundary is the left-most vertical partition boundary, but as the grid graph builder 201 iterates through operations 705, 710, 715, and 720, the grid graph builder 201 processes each identified partition boundary while traversing the identified vertical partition boundaries (e.g., from left to right or from right to left).

Responsive to a determination that the current vertical partition boundary does not align with a vertical grid line, the grid graph builder 201, at operation 710, creates a vertical grid line to the grid graph at the location of the vertical partition boundary.

Responsive to a determination that the current vertical partition boundary does align with a vertical grid line or upon creating the vertical grid line, the grid graph builder 201, at operation 715, determines whether the current partition includes additional vertical boundaries. Responsive to a determination that the current partition does include at least one additional vertical boundary, the grid graph builder 201 returns to operation 705, where the next vertical partition boundary (e.g., the vertical partition boundary immediately above the current partition boundary) becomes the current partition boundary for the purposes of operation 705.

Responsive to a determination that the current partition does not include additional vertical boundaries, the grid graph builder 201, at operation 720, determines whether the design layout 210 includes additional partitions. Responsive to a determination that the design layout 210 includes at least one additional partition, the grid graph builder 201 returns to operation 705, where the next partition (e.g., the partition immediately above the current partition) becomes the current partition, and the bottom-most vertical partition boundary of that partition becomes the current partition boundary for the purposes of operation 705. Responsive to a determination that the design layout 210 does not include additional partitions, the operation 510 terminates, and the method 400 proceeds to operation 425.

Figure 8:
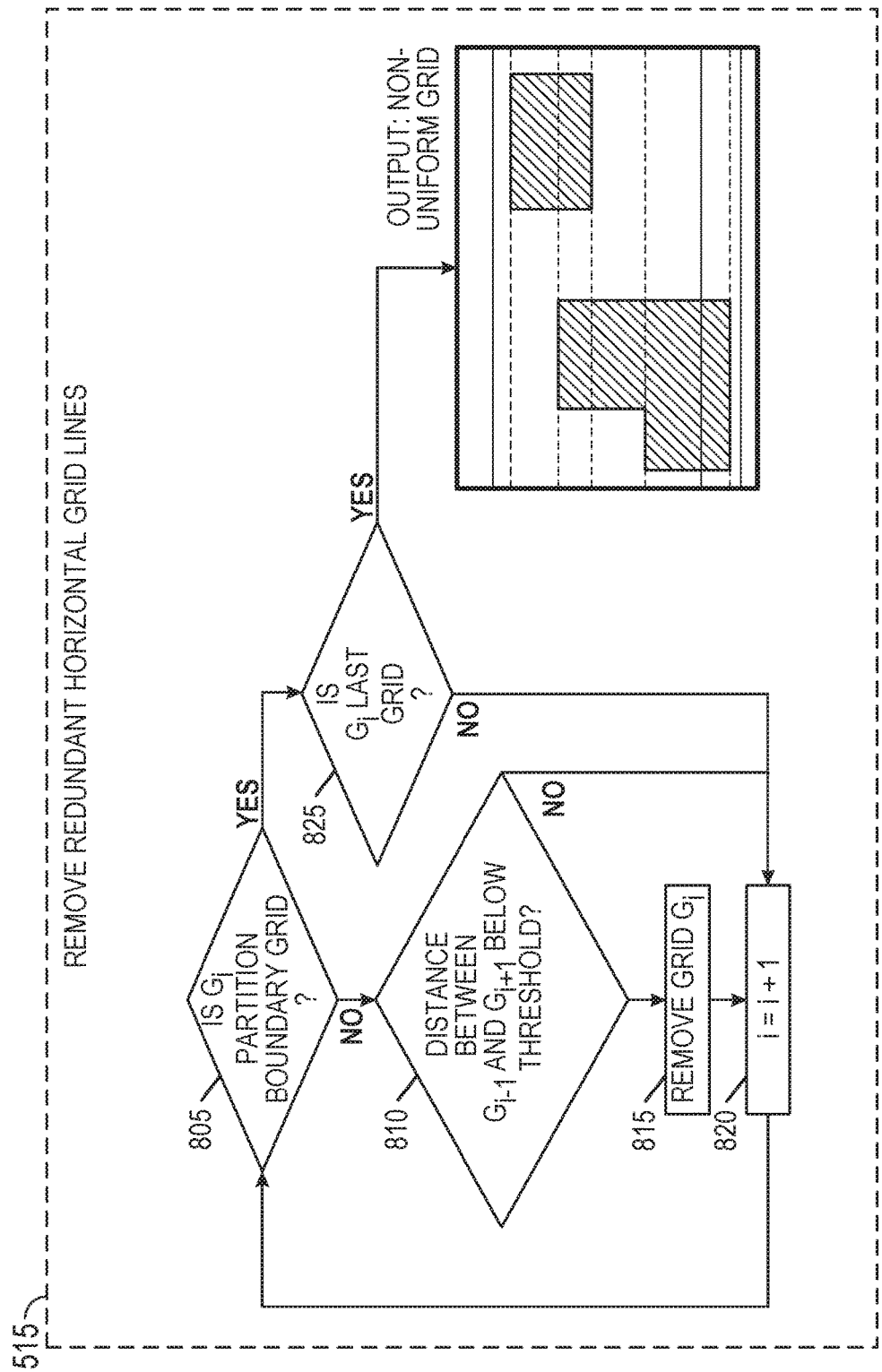

As shown in FIG. 8, the operation 515 of the method 400 may include operations 805, 810, 815, 820, and 825. In the context of FIG. 8, $G_i$ represents the i-th horizontal grid line in the non-uniform grid graph (e.g., from bottom to top or from top to bottom), and i, which is also referred to as the "grid line counter," is set to 2.

At operation 805, the grid graph builder 201 determines whether the current horizontal grid line, $G_i$, aligns with a horizontal partition boundary. Responsive to determining $G_i$ does not align with a horizontal partition boundary, the graph builder 201, at operation 810, determines whether a distance between the grid line immediately preceding $G_i$ ($G_{i-1}$) and the grid line immediately succeeding $G_i$ ($G_{i+1}$) is below a predefined threshold distance. As noted above, the predefined threshold distance may be supplied by a user via GUI 101 or may be a default value.

Responsive to a determination that the distance is below the predefined threshold, the grid graph builder 201, at operation 815, removes the grid line $G_i$. Responsive to a determination that the distance is not below the predefined threshold, the method 400 proceeds to operation 820. At operation 820, the grid graph builder 201 increments the grid counter, i, by 1, and the method 400 returns to operation 805.

If at operation 805, the grid graph builder 201 determines the current horizontal grid line, $G_i$, aligns with a horizontal partition boundary, the method 400 proceeds to operation 825, where the grid graph builder 201 determines whether $G_i$ is the last horizontal grid line (e.g., the top or bottom most grid line) in the grid graph. If the grid graph builder 201 determines at operation 825 that $G_i$ is not the last horizontal grid line (e.g., the top or bottom most grid line) in the grid graph, the method 400 proceeds to operation 820, where the grid graph builder 201 increments the grid counter, i, by 1, and the method 400 returns to operation 805. If the grid graph builder 201 determines at operation 825 that $G_i$ is the last horizontal grid line (e.g., the top or bottom most grid line) in the grid graph, the operation 515 terminates and the result is a non-uniform grid graph where redundant horizontal grid lines have been removed.

Figure 9:
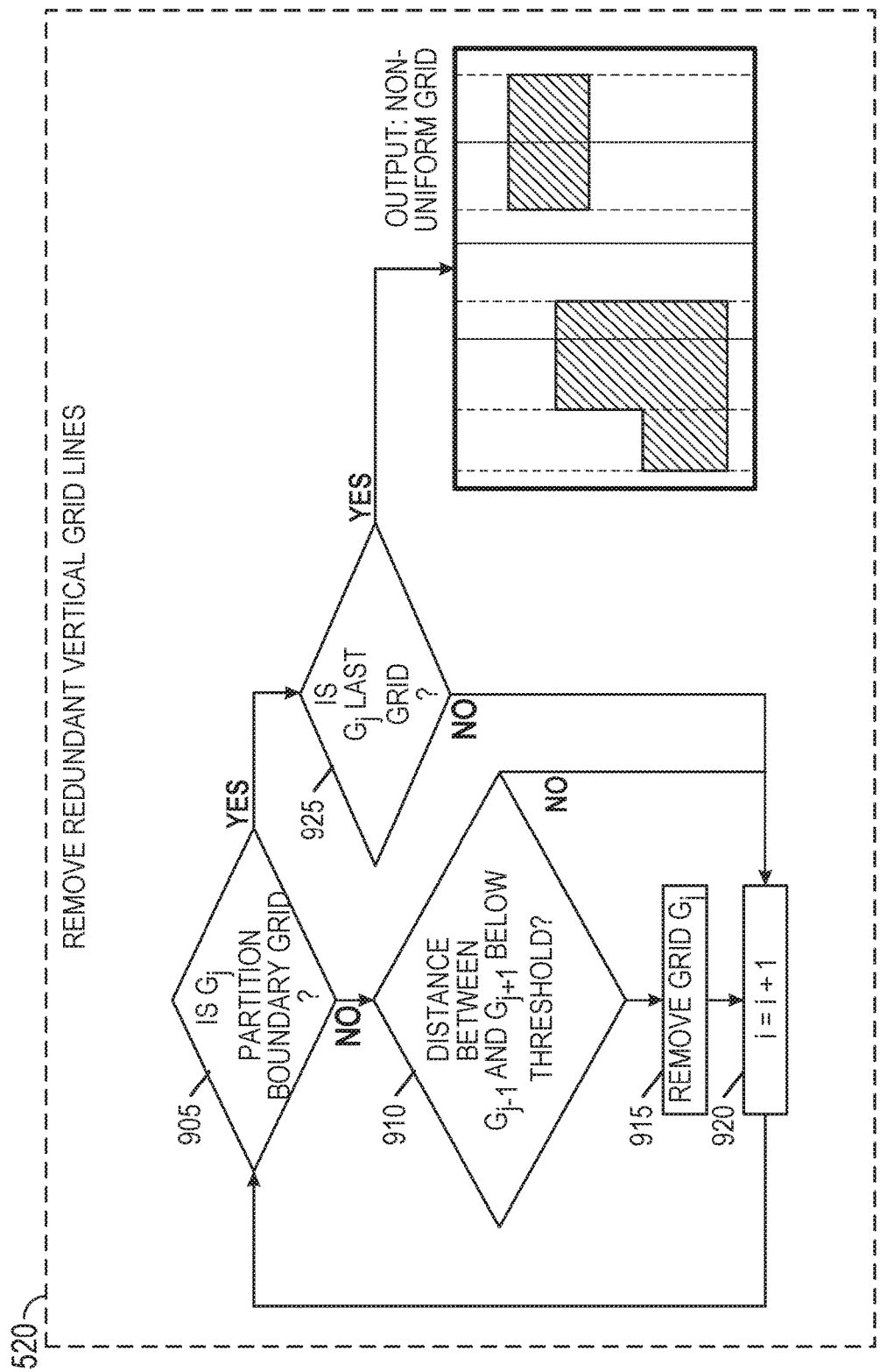

As shown in FIG. 9, the operation 520 of the method 400 may include operations 905, 910, 915, 920, and 925. In the context of FIG. 9, $G_j$ represents the j-th vertical grid line in the non-uniform grid graph (e.g., from left to right or from right to left), and j (i.e., the grid line counter) is set to 2.

At operation 905, the grid graph builder 201 determines whether the current vertical grid line, $G_j$, aligns with a vertical partition boundary. Responsive to determining $G_j$ does not align with a vertical partition boundary, the grid graph builder 201, at operation 910, determines whether a distance between the grid line immediately preceding $G_j$ ($G_{j-1}$) and the grid line immediately succeeding $G_j$ ($G_{j+1}$) is below a predefined threshold distance. As noted above, the predefined threshold distance may be supplied by a user via GUI 101 or may be a default value.

Responsive to a determination that the distance is below the predefined threshold, the grid graph builder 201, at operation 915, removes the grid line $G_j$. Responsive to a determination that the distance is not below the predefined threshold, the method 400 proceeds to operation 920. At operation 920, the grid graph builder 201 increments the grid counter, j, by 1, and the method 400 returns to operation 905.

If, at operation 905, the grid graph builder 201 determines the current vertical grid line, $G_j$, aligns with a vertical partition boundary, the method 400 proceeds to operation 925, where the grid graph builder 201 determines whether $G_j$ is the last vertical grid line (e.g., the left or right most grid line) in the grid graph. If the grid graph builder 201 determines at operation 925 that $G_j$ is not the last vertical grid line (e.g., the left or right most grid line) in the grid graph, the method 400 proceeds to operation 920, where the grid graph builder 201 increments the grid counter, j, by 1, and the method 400 returns to operation 905. If the grid graph builder 201 determines at operation 925 that $G_j$ is the last vertical grid line (e.g., the left or right most grid line) in the grid graph, the operation 520 terminates and the result is the non-uniform partition aware grid graph 220.

Figure 10A:
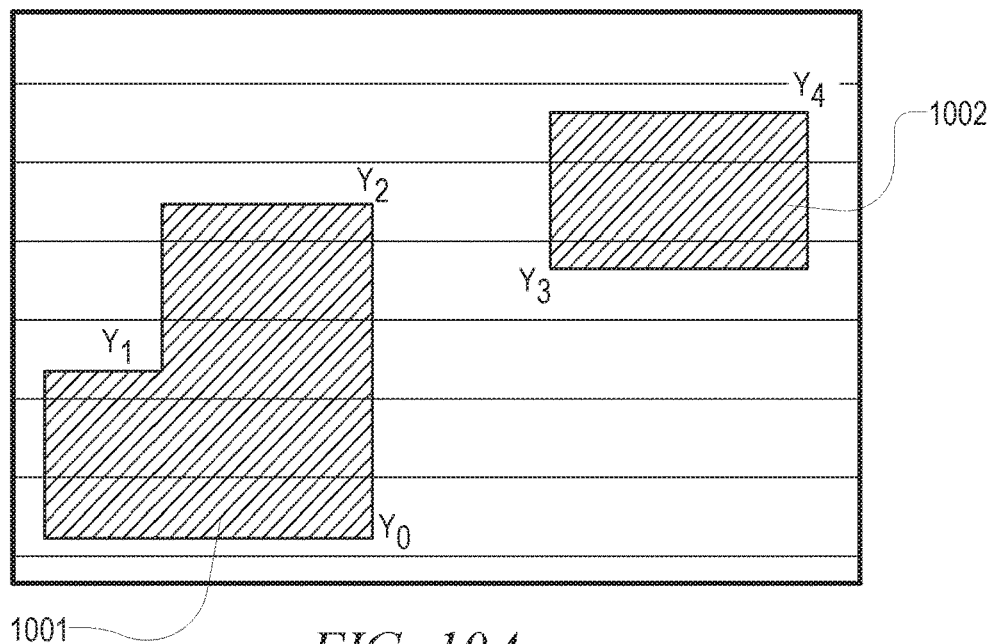
FIGS. 10A and 10B are conceptual diagrams that graphically illustrate an operation of adding additional horizontal grid lines to a uniform grid graph, which is performed as part of the method for building the partition-aware grid graph, according to some example embodiments.
Figure 10B:
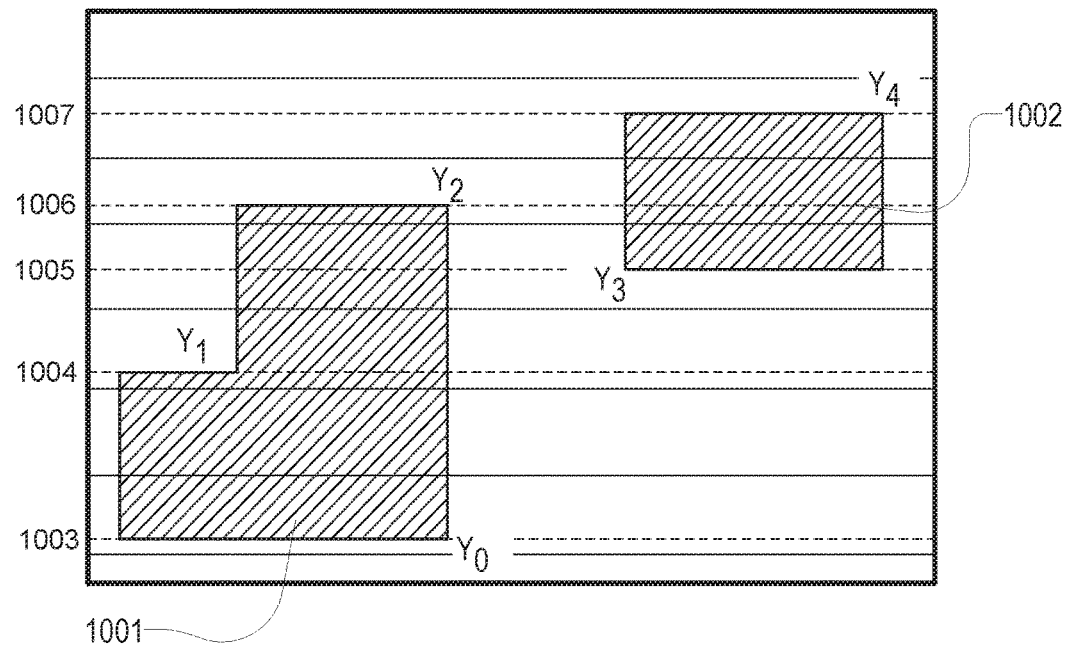

FIG. 10 is conceptual diagram that graphically illustrates the operation of adding additional horizontal grid lines to a uniform grid graph, which may correspond to operation 505 of method 400, according to some example embodiments. As shown in FIG. 10A, a uniform grid structure is superimposed over a design layout that includes partitions 1001 and 1002. For purposes of explanation, vertical grid lines in the grid structure have been omitted from the illustration. The partition 1001 is illustrated as including horizontal boundaries $Y_0$, $Y_1$, and $Y_2$ and partition 1002 is illustrated as including horizontal boundaries $Y_3$ and $Y_4$. As shown in FIG. 10B, additional horizontal grid lines 1003-1007 have been added to the grid structure such that each of the horizontal partition boundaries $Y_0$, $Y_1$, $Y_2$, $Y_3$, and $Y_4$ align with a grid line. More specifically, grid line 1003 has been added at the position of $Y_0$; grid line 1004 has been added at the position of $Y_1$; grid line 1006 has been added at the position of $Y_2$; grid line 1005 has been added at the position of $Y_3$; and grid line 1007 has been added at the position of $Y_4$.

Figure 11A:
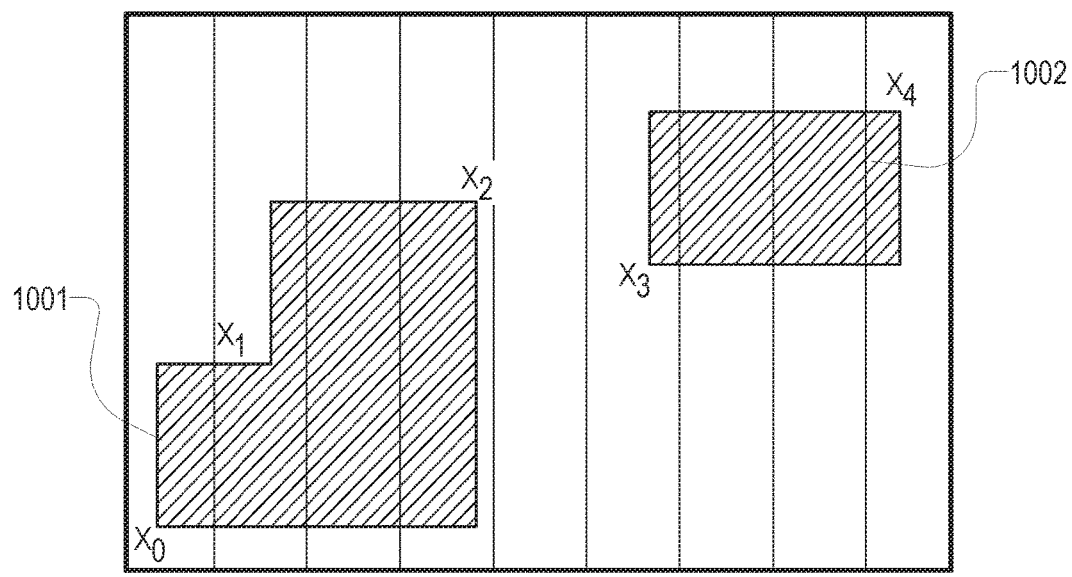
FIGS. 11A and 11B are conceptual diagrams that graphically illustrate an operation of adding additional vertical grid lines to a uniform grid graph, which is performed as part of the method for building the partition-aware grid graph, according to some example embodiments.
Figure 11B:
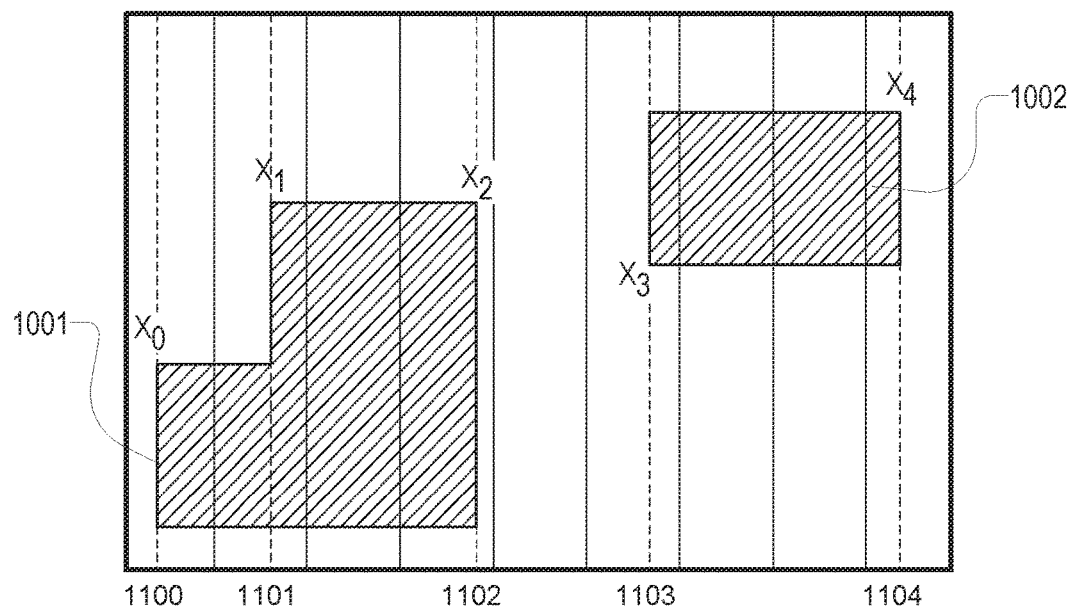

FIG. 11 is conceptual diagram that graphically illustrates the operation of adding additional vertical grid lines to a uniform grid structure, which may correspond to operation 510 of method 400, according to some example embodiments, according to some example embodiments. As shown in FIG. 11A, the uniform grid structure is again superimposed over the design layout that includes the partitions 1001 and 1002 referenced above. For purposes of explanation, horizontal grid lines in the grid structure have been omitted from the illustration. The partition 1001 is illustrated as including vertical boundaries $X_0$, $X_1$, and $X_2$ and partition 1002 is illustrated as including vertical boundaries $X_3$ and $X_4$. As shown in FIG. 11B, additional vertical grid lines 1100-1104 have been added by the grid graph builder 201 to the grid structure such that each of the vertical partition boundaries $X_0$, $X_1$, $X_2$, $X_3$, and $X_4$ align with a grid line. More specifically, grid line 1100 has been added at the position of $X_0$; grid line 1101 has been added at the position of $X_1$; grid line 1102 has been added at the position of $X_2$; grid line 1103 has been added at the position of $X_3$; and grid line 1104 has been added at the position of $X_4$.

FIG. 12 is conceptual diagram that graphically illustrates an operation of removing redundant horizontal grid lines from a non-uniform grid graph, which may correspond to operation 515 of the method 400, according to some example embodiments. As shown in FIG. 12A, the non-uniform grid graph resulting from the operations illustrated in FIG. 10 and FIG. 11 is superimposed over the design layout that includes partitions 1001 and 1002, although the vertical grid lines have been omitted from the illustration for purposes of explanation. The non-uniform grid graph includes horizontal grid lines 1201-1212. Following the process illustrated in FIG. 8 and described above, the grid graph builder 201 begins its processing with grid line 1202 (e.g., the grid line counter, i, is initially set to 2), which the grid graph builder 201 identifies as being aligned with a partition boundary (e.g., at operation 805), so the grid graph builder 201 moves to grid line 1203 (e.g., i=3 as a result of operation 820). In processing grid line 1203, the grid graph builder 201 determines the distance between grid line 1202 (i.e., the grid line immediately preceding grid line 1203) and grid line 1204 (i.e., the grid line immediately succeeding grid line 1203) is above the predefined threshold distance (e.g., at operation 810), and thus, the grid line 1203 is considered to be non-redundant. As such, the grid graph builder 201 proceeds to process grid line 1204 (e.g., i=4 as a result of operation 820), and in doing so, the grid graph builder 201 determines that the distance between grid line 1203 (i.e., the grid line immediately preceding grid line 1204) and grid line 1205 (i.e., the grid line immediately succeeding grid line 1204) is below the predefined threshold distance (e.g., at operation 810). Thus, the grid line 1204 is considered to be a redundant grid line.

Figure 12A:
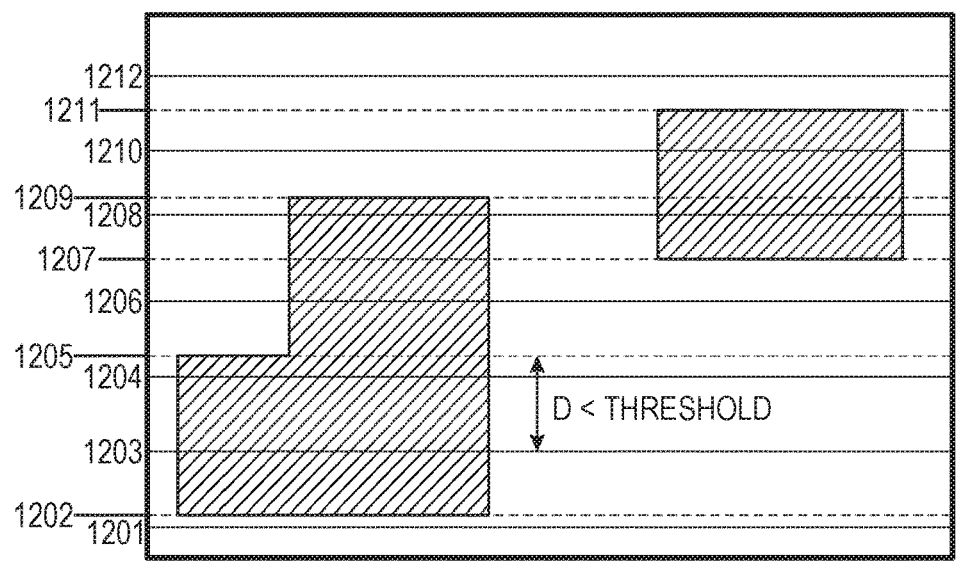
FIGS. 12A-12D are conceptual diagrams that graphically illustrate an operation of removing redundant horizontal grid lines from a non-uniform grid graph, which is performed as part of the method for building the partition-aware grid graph, according to some example embodiments.
Figure 12B:
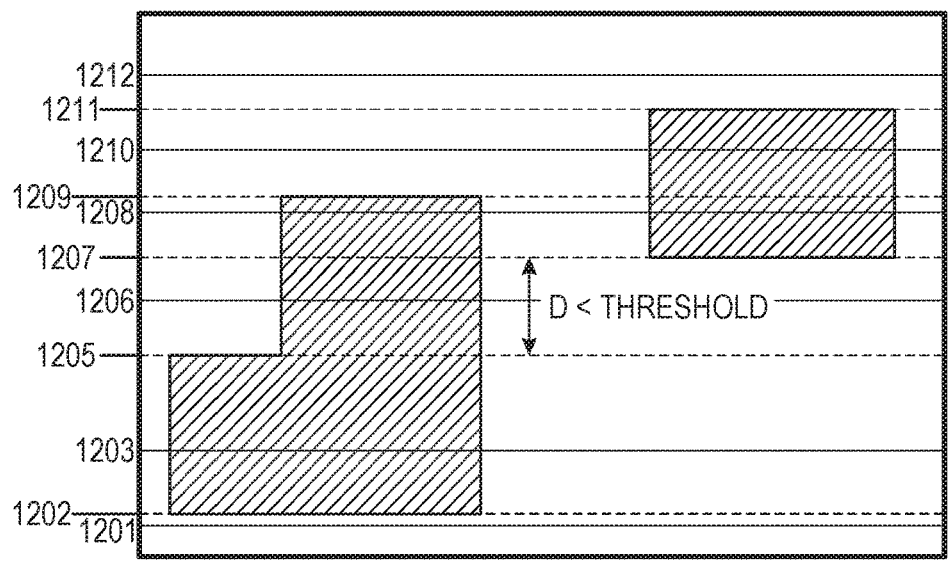

Accordingly, as shown in FIG. 12B, grid line 1204 has been removed (e.g., at operation 815). The redundant horizontal grid line removal process continues (e.g., where i=5) as the grid graph builder 201 determines that grid line 1205 aligns with a partition boundary (e.g., at operation 805), and as such, the grid graph builder 201 proceeds to process grid line 1206 (e.g., i=6 as a result of operation 820). In doing so, the grid graph builder 201 determines that the distance between grid line 1205 (i.e., the grid line immediately preceding grid line 1206) and grid line 1207 (i.e., the grid line immediately succeeding grid line 1206) is below the predefined threshold distance (e.g., at operation 810). Thus, the grid line 1206 is considered to be a redundant grid line.

Figure 12C:
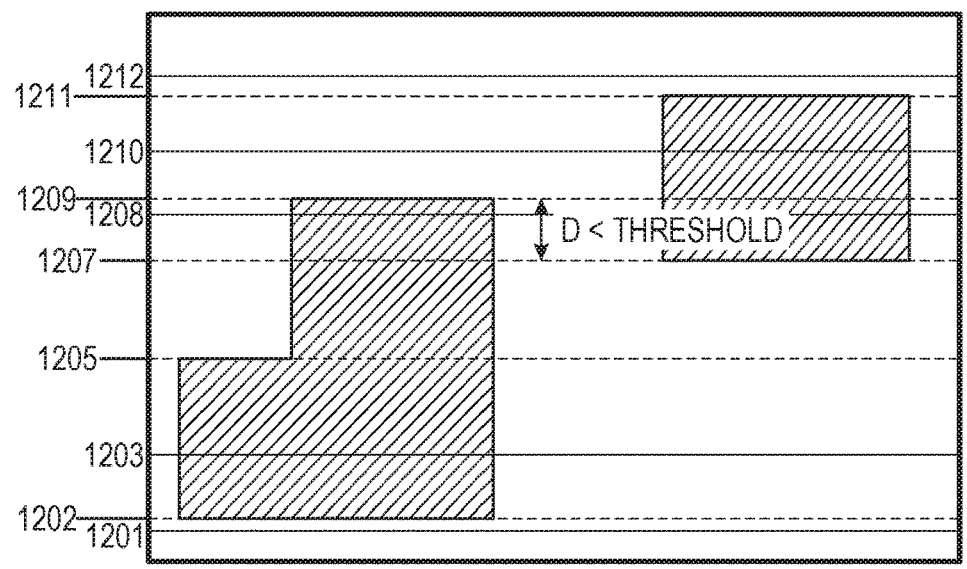

Accordingly, as shown in FIG. 12C, grid line 1206 has been removed (e.g., at operation 815). The redundant horizontal grid line removal process continues (e.g., where i=7) as the grid graph builder 201 determines that grid line 1207 aligns with a partition boundary (e.g., at operation 805), and as such, the grid graph builder 201 proceeds to process grid line 1208 (e.g., i=8 as a result of operation 820). In doing so, the grid graph builder 201 determines that the distance between grid line 1207 (i.e., the grid line immediately preceding grid line 1208) and grid line 1209 (i.e., the grid line immediately succeeding grid line 1208) is below the predefined threshold distance (e.g., at operation 810). Thus, the grid line 1208 is considered to be a redundant grid line.

Figure 12D:
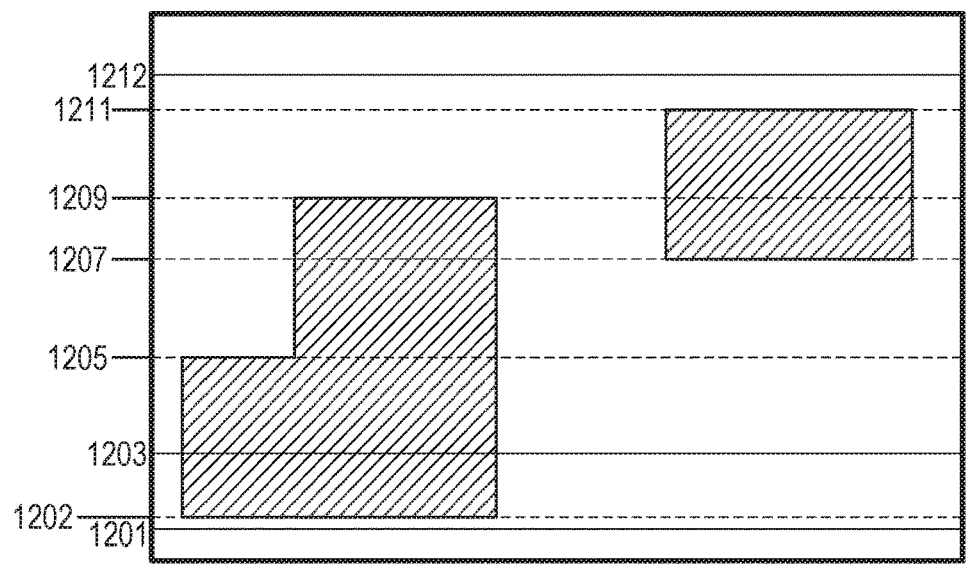

Accordingly, as shown in FIG. 12D, grid line 1208 has been removed (e.g., at operation 815). Further, as shown in FIG. 12D, the forgoing process is repeat for each of the remaining grid lines 1209-1212, and as a result, grid line 1210 is removed.

FIG. 13 is conceptual diagram that graphically illustrates an operation of removing redundant vertical grid lines from a non-uniform grid graph, which may correspond to operation 520 of the method 400, according to some example embodiments. As shown in FIG. 13A, the non-uniform grid graph resulting from the operations illustrated in FIG. 10 and FIG. 11 is superimposed over the design layout that includes partitions 1001 and 1002, although the horizontal grid lines have been omitted from the illustration for purposes of explanation. The non-uniform grid graph includes vertical grid lines 1301-1313. Following the process illustrated in FIG. 9 and described above, the grid graph builder 201 begins its processing with grid line 1302 (e.g., the grid line counter, j, is initially set to 2), which the grid graph builder 201 determines to be a redundant grid line based on a determination that the distance between grid line 1301 (i.e., the grid line immediately preceding grid line 1302) and grid line 1303 (i.e., the grid line immediately succeeding grid line 1302) is below the predefined threshold distance (e.g., at operation 910). Accordingly, as shown in FIG. 13B, grid line 1302 has been removed (e.g., at operation 915). The redundant vertical grid line removal process continues (e.g., where j=3) with the grid graph builder 201 determining that the next vertical grid line, grid line 1303, is aligned with a partition boundary (e.g., at operation 905).

As such, the grid graph builder 201 moves to grid line 1304 (e.g., j=4 as a result of operation 920). In processing grid line 1304, the grid graph builder 201 determines that the distance between grid line 1303 (i.e., the grid line immediately preceding grid line 1304) and grid line 1305 (i.e., the grid line immediately succeeding grid line 1304) is below the predefined threshold distance (e.g., at operation 910), and thus, the grid line 1304 is considered to be redundant. As such, the grid graph builder 201 removes grid line 1304 (e.g., at operation 915) as shown in FIG. 13C.

The graph builder 201 proceeds to process grid line 1305 (e.g., j=5 as a result of operation 920), and in doing so, the grid graph builder 201 determines that the distance between grid line 1304 (i.e., the grid line immediately preceding grid line 1305) and grid line 1306 (i.e., the grid line immediately succeeding grid line 1305) is above the predefined threshold distance (e.g., at operation 910), and as such, the grid line 1305 is non-redundant. Accordingly, the graph builder 201 proceeds to process grid line 1306 (e.g., j=6 as a result of operation 920), and in doing so, the grid graph builder 201 determines that grid line 1306 is also non-redundant for the same reason (e.g., is aligned with a partition boundary).

The graph builder 201 proceeds to process grid line 1307 (e.g., j=7 as a result of operation 920), and in doing so, the grid graph builder 201 determines that the distance between grid line 1306 (i.e., the grid line immediately preceding grid line 1307) and grid line 1308 (i.e., the grid line immediately succeeding grid line 1307) is below the predefined threshold distance (e.g., at operation 910). Thus, the grid line 1307 is considered to be a redundant grid line.

Figure 13A:
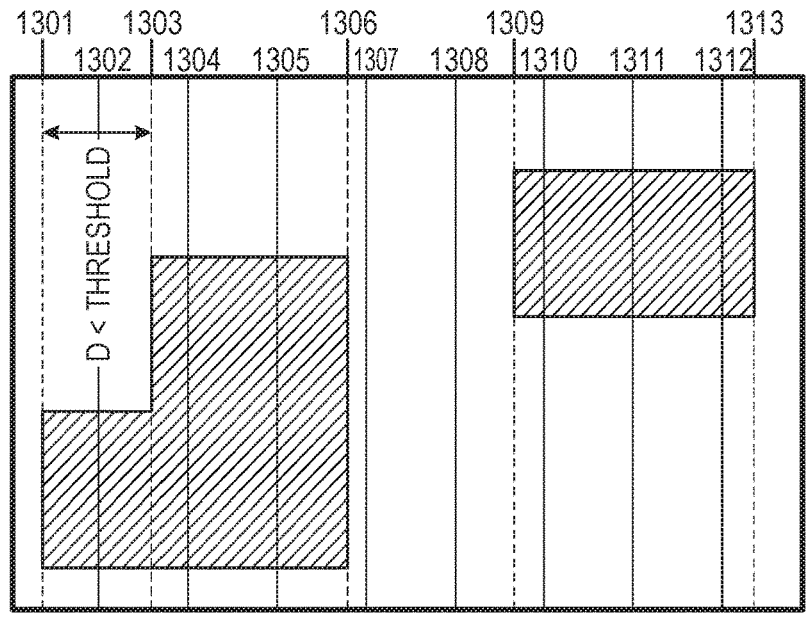
FIG. 13A-E are conceptual diagrams that graphically illustrate an operation of removing redundant vertical grid lines from a non-uniform grid graph, which is performed as part of the method for building the partition-aware grid graph, according to some example embodiments.
Figure 13B:
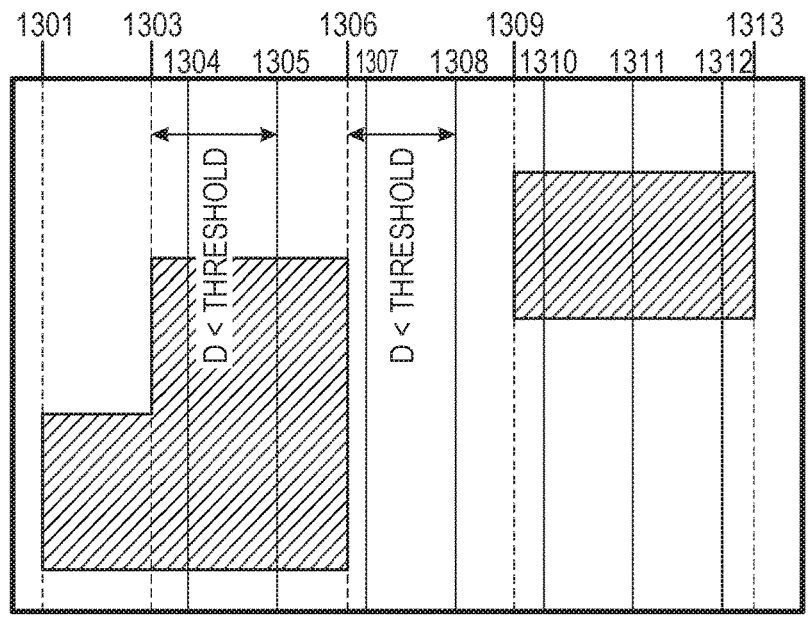
Figure 13C:
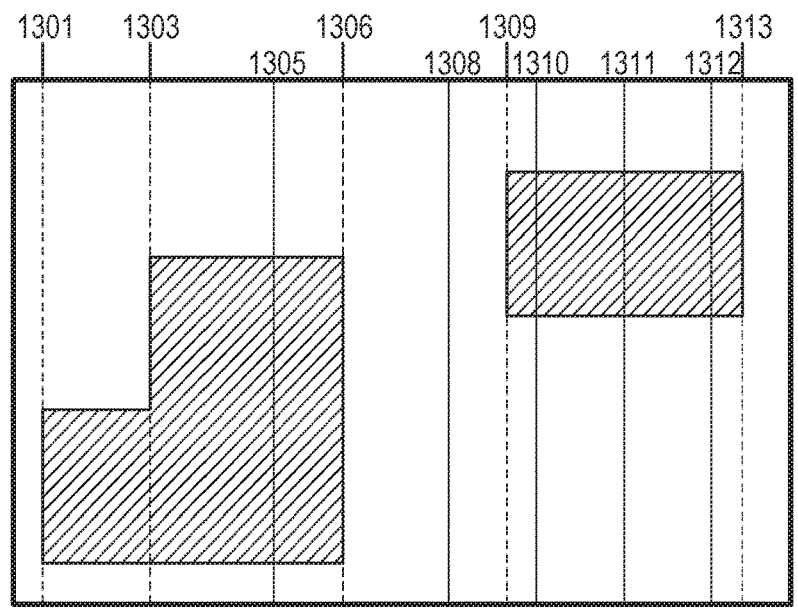

Accordingly, as shown in FIG. 13C, grid line 1307 has been removed (e.g., at operation 915). The redundant vertical grid line removal process continues (e.g., where j=8) as the grid graph builder 201 determines that the distance between grid line 1307 (i.e., the grid line immediately preceding grid line 1308) and grid line 1309 (i.e., the grid line immediately succeeding grid line 1308) is above the predefined threshold distance (e.g., at operation 910). Thus, grid line 1308 is determined to be non-redundant and the grid graph builder 201 proceeds to process grid line 1309 (e.g., j=9 as a result of operation 920). Grid graph builder 201 determines that grid line 1309 aligns with a partition boundary (e.g., at operation 905), and as such, the grid graph builder 201 proceeds to process grid line 1310 (e.g., j=10 as a result of operation 920).

Figure 13D:
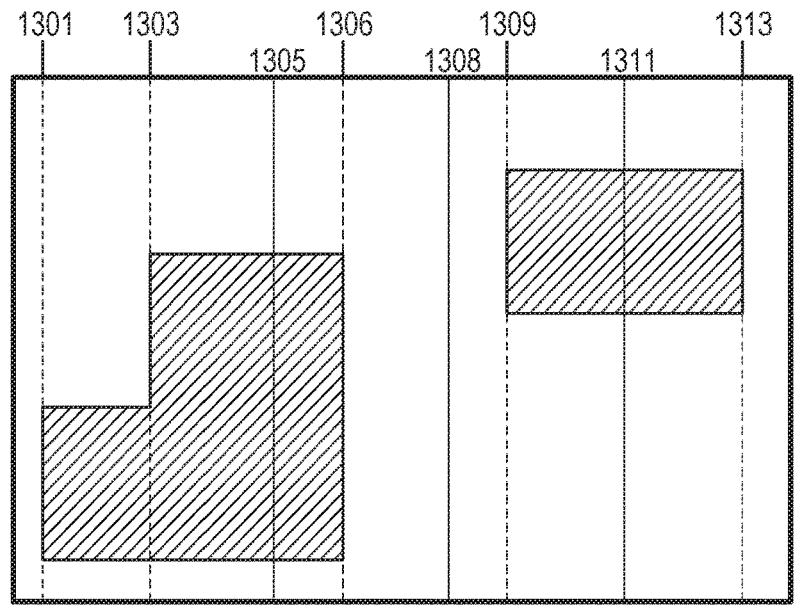
Figure 13E:
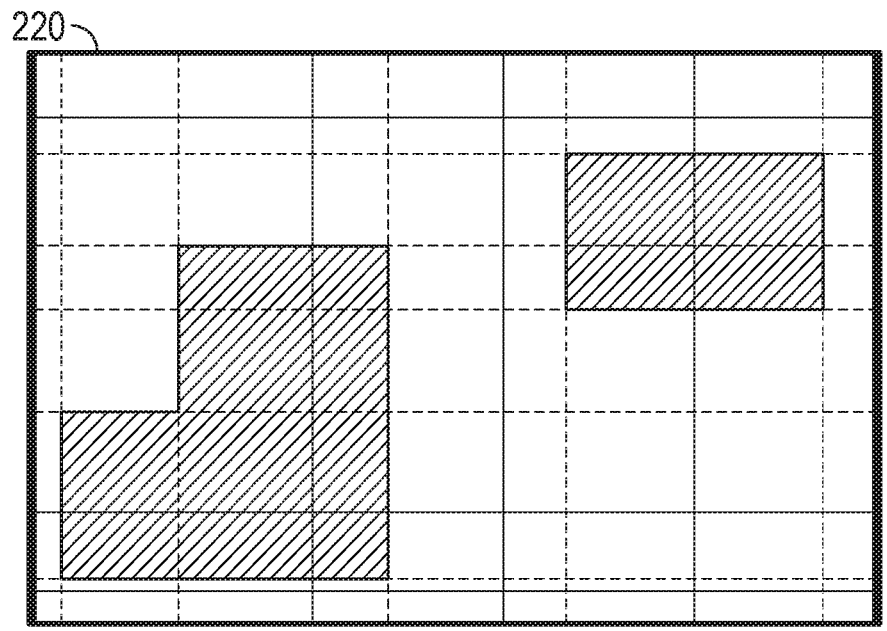

As shown in FIG. 13D, the forgoing process is repeated for each of the remaining grid lines 1310-1313, and as a result, grid lines 1310 and 1312 are removed. The resulting output illustrated in FIG. 13(e) corresponds to the partition-aware grid graph 220.

Electronic Apparatus and System

Example embodiments may be implemented in digital electronic circuitry, in computer hardware, firmware, or software, or in combinations of them. Example embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

Figure 14:
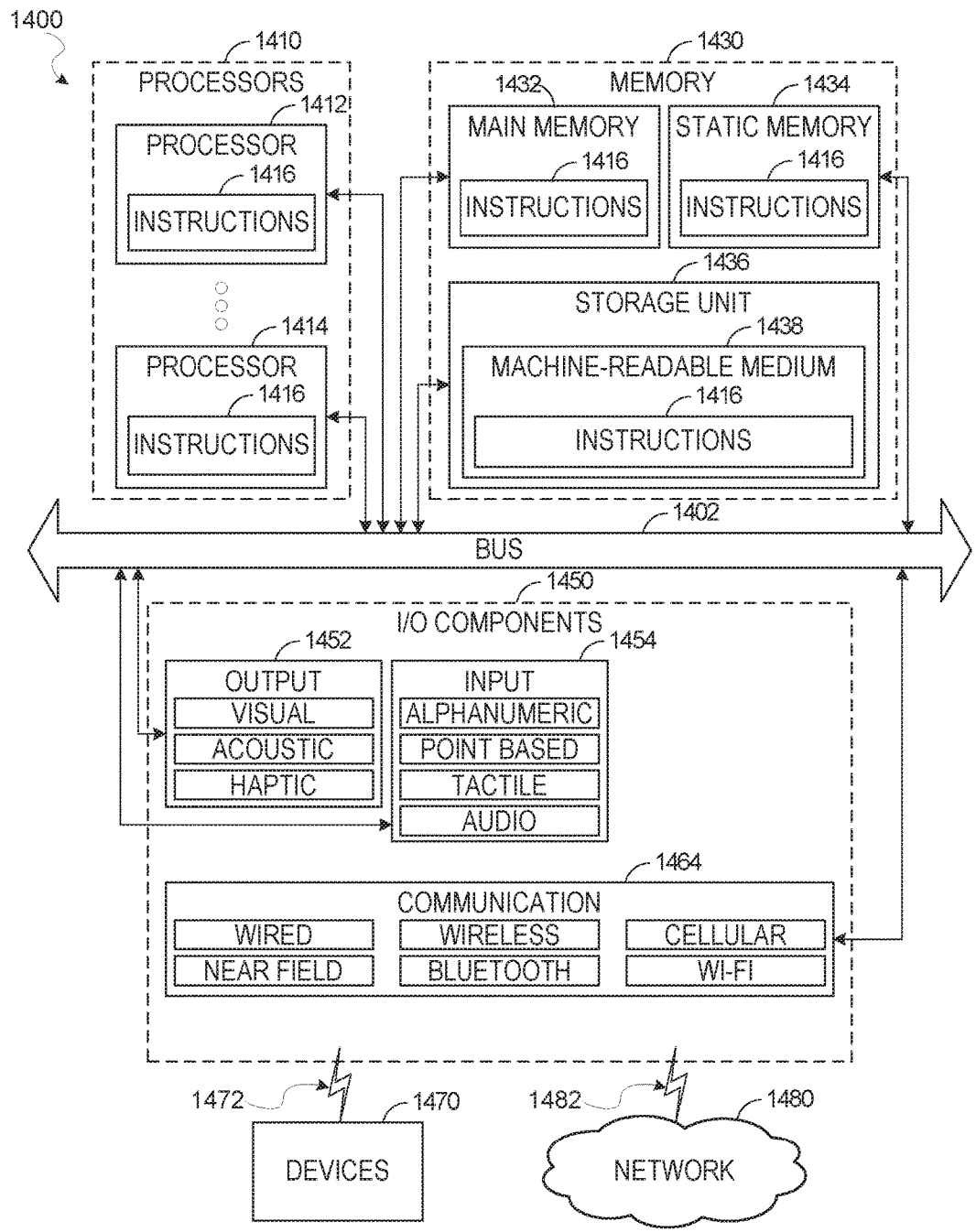
FIG. 14 is a diagrammatic representation of a machine in the example form of a computer system within which a set of instructions for causing the machine to perform any one or more of the methodologies discussed herein may be stored and executed.

FIG. 14 illustrates a diagrammatic representation of a machine 1400 in the form of a computer system within which a set of instructions may be executed for causing the machine to perform any one or more of the methodologies discussed herein, according to an example embodiment. Specifically, FIG. 14 shows a diagrammatic representation of the machine 1400 in the example form of a computer system, within which instructions 1416 (e.g., software, a program, an application, an applet, an app, or other executable code) for causing the machine 1400 to perform any one or more of the methodologies discussed herein may be executed. For example, the instructions 1416 may cause the machine 1400 to execute the method 400. Additionally, or alternatively, the instructions 1416 may implement FIGS. 1-3, 10, 11, 12A-D, and 13A-D. The instructions 1416 transform the general, non-programmed machine 1400 into a particular machine 1400, such as the routing engine 104, programmed to carry out the described and illustrated functions in the manner described. In alternative embodiments, the machine 1400 operates as a standalone device or may be coupled (e.g., networked) to other machines. In a networked deployment, the machine 1400 may operate in the capacity of a server machine or a client machine in a server-client network environment, or as a peer machine in a peer-to-peer (or distributed) network environment. The machine 1400 may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 1416, sequentially or otherwise, that specify actions to be taken by the machine 1400. Further, while only a single machine 1400 is illustrated, the term "machine" shall also be taken to include a collection of machines 1400 that individually or jointly execute the instructions 1416 to perform any one or more of the methodologies discussed herein.

The machine 1400 may include processors 1410, memory 1430, and I/O components 1450, which may be configured to communicate with each other such as via a bus 1402. In an example embodiment, the processors 1410 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) may include, for example, a processor 1412 and a processor 1414 that may execute the instructions 1416. The term "processor" is intended to include multi-core processors 1410 that may comprise two or more independent processors (sometimes referred to as "cores") that may execute instructions 1416 contemporaneously. Although FIG. 14 shows multiple processors, the machine 1400 may include a single processor with a single core, a single processor with multiple cores (e.g., a multi-core processor), multiple processors with a single core, multiple processors with multiples cores, or any combination thereof.

The memory 1430 may include a main memory 1432, a static memory 1434, and a storage unit 1436, both accessible to the processors 1410 such as via the bus 1402. The main memory 1432, the static memory 1434, and storage unit 1436 store the instructions 1416 embodying any one or more of the methodologies or functions described herein. The instructions 1416 may also reside, completely or partially, within the main memory 1432, within the static memory 1434, within the storage unit 1436, within at least one of the processors 1410 (e.g., within the processor's cache memory), or any suitable combination thereof, during execution thereof by the machine 1400.

The I/O components 1450 may include a wide variety of components to receive input, provide output, produce output, transmit information, exchange information, capture measurements, and so on. The specific I/O components 1450 that are included in a particular machine will depend on the type of machine. For example, portable machines such as mobile phones will likely include a touch input device or other such input mechanisms, while a headless server machine will likely not include such a touch input device. It will be appreciated that the I/O components 1450 may include many other components that are not shown in FIG. 14. The I/O components 1450 are grouped according to functionality merely for simplifying the following discussion and the grouping is in no way limiting. In various example embodiments, the I/O components 1450 may include output components 1452 and input components 1454. The output components 1452 may include visual components (e.g., a display such as a plasma display panel (PDP), a light emitting diode (LED) display, a liquid crystal display (LCD), a projector, or a cathode ray tube (CRT)), acoustic components (e.g., speakers), other signal generators, and so forth. The input components 1454 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 1450 may include communication components 1464 operable to couple the machine 1400 to a network 1480 or devices 1470 via a coupling 1482 and a coupling 1472, respectively. For example, the communication components 1464 may include a network interface component or another suitable device to interface with the network 1480. In further examples, the communication components 1464 may include wired communication components, wireless communication components, cellular communication components, and other communication components to provide communication via other modalities. The devices 1470 may be another machine or any of a wide variety of peripheral devices (e.g., a peripheral device coupled via a USB).

Executable Instructions and Machine Storage Medium

The various memories (i.e., 1430, 1432, 1434, and/or memory of the processor(s) 1410) and/or storage unit 1436 may store one or more sets of instructions 1416 and data structures (e.g., software) embodying or utilized by any one or more of the methodologies or functions described herein. These instructions 1416, when executed by processor(s) 1410, cause various operations to implement the disclosed embodiments.

As used herein, the terms "machine-storage medium," "device-storage medium," "computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks. The terms "machine-storage media," "computer-storage media," and "device-storage media" spe-cifically exclude carrier waves, modulated data signals, and other such media, at least some of which are covered under the term "signal medium" discussed below.

Transmission Medium

In various example embodiments, one or more portions of the network 1480 may be an ad hoc network, an intranet, an extranet, a VPN, a LAN, a WLAN, a WAN, a WWAN, a MAN, the Internet, a portion of the Internet, a portion of the PSTN, a plain old telephone service (POTS) network, a cellular telephone network, a wireless network, a Wi-Fi® network, another type of network, or a combination of two or more such networks. For example, the network 1480 or a portion of the network 1480 may include a wireless or cellular network, and the coupling 1482 may be a Code Division Multiple Access (CDMA) connection, a Global System for Mobile communications (GSM) connection, or another type of cellular or wireless coupling. In this example, the coupling 1482 may implement any of a variety of types of data transfer technology, such as Single Carrier Radio Transmission Technology (1xRTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology.

The instructions 1416 may be transmitted or received over the network 1480 using a transmission medium via a network interface device (e.g., a network interface component included in the communication components 1464) and utilizing any one of a number of well-known transfer protocols (e.g., hypertext transfer protocol (HTTP)). Similarly, the instructions 1416 may be transmitted or received using a transmission medium via the coupling 1472 (e.g., a peer-to-peer coupling) to the devices 1470. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 1416 for execution by the machine 1400, and includes digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a matter as to encode information in the signal.

Computer Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A system comprising:
   one or more processors of a machine; and
   a computer-readable medium storing instructions, which when executed by the machine, cause the machine to perform operations comprising:
   accessing a design layout defining a layout of components of an integrated circuit design, the design layout including one or more partitions;
   building a uniform grid graph by superimposing a uniform grid structure over the design layout, the uniform grid structure comprising a plurality of perpendicular grid lines that form a plurality of grid cells having uniform dimensions;
   identifying boundaries of the one or more partitions, the boundaries of the one or more partitions corresponding to one or more unrouteable regions in the integrated circuit design based on one or more routing constraints;
   inserting one or more additional grid lines into the uniform grid structure such that each of the identified partition boundaries is aligned with a grid line, the inserting of the one or more additional grid lines resulting in a non-uniform grid graph;
   removing one or more redundant grid lines from the non-uniform grid graph, the removing of the one or more redundant grid lines resulting in a partition-aware grid graph; and
   using the partition-aware grid graph to route the integrated circuit design.

2. The system of claim 1, wherein the inserting of the one or more additional grid lines into the uniform grid structure comprises:
   adding one or more horizontal grid lines in the grid structure, each of the one or more horizontal grid lines being aligned with a horizontal partition boundary; and
   adding one or more vertical grid lines in the grid structure, each of the one or more vertical grid lines being aligned with a vertical partition boundary.

3. The system of claim 2, wherein the adding of the one or more horizontal grid lines in the uniform grid structure comprises:
   determining whether a horizontal partition boundary aligns with a grid line of the uniform grid structure; and
   responsive to a determination that the horizontal partition boundary does not align with a grid line of the uniform grid structure, creating a horizontal grid line at a location of the horizontal partition boundary.

4. The system of claim 2, wherein the adding of the one or more vertical grid lines in the uniform grid structure comprises:
   determining whether a vertical partition boundary aligns with a grid line of the uniform grid structure; and
   responsive to a determination that the vertical partition boundary does not align with a grid line of the uniform grid structure, creating a vertical grid line at a location of the vertical partition boundary.

5. The system of claim 1, wherein the removing of the one or more redundant grid lines from the non-uniform grid graph comprises:
   determining that a grid line in the non-uniform grid graph does not align with a partition boundary; and
   determining that the grid line in the non-uniform grid graph is redundant based on a distance between a preceding grid line and a succeeding grid line.

6. The system of claim 5, wherein the grid line is identified as being redundant based on the distance between the preceding grid line and the succeeding grid line being below a predefined distance threshold.

7. The system of claim 6, wherein the predefined distance threshold is specified by a user via a graphical user interface.

8. The system of claim 1, wherein the removing of the one or more redundant grid lines from the non-uniform grid graph comprises:

removing one or more redundant horizontal grid lines from the non-uniform grid graph; and removing one or more redundant vertical grid lines from the non-uniform grid graph.

9. The system of claim 8, wherein the removing of the one or more redundant horizontal grid lines comprises:

determining that a first horizontal grid line is redundant based on a distance between a second and third horizontal grid line being below a predefined distance threshold, the second horizontal grid line being below the first horizontal grid line, and the third horizontal grid line being above the first horizontal grid line.

10. The system of claim 8, wherein the removing of the one or more redundant vertical grid lines comprises:

determining a first vertical grid line is redundant based on a distance between a second and third vertical grid line being below a predefined distance threshold, wherein the second vertical grid line is left of the first vertical grid line, wherein the third vertical grid line is right of the first vertical grid line.

11. A method comprising:

accessing a design layout of an integrated circuit design that includes one or more partitions, the one or more partitions corresponding to one or more unrouteable regions in the integrated circuit design based on one or more routing constraints;

building a uniform grid graph comprising a uniform grid structure superimposed over the design layout, the uniform grid structure comprising a plurality of perpendicular grid lines that form a plurality of grid cells having uniform dimensions;

inserting, by one or more processors of a machine, one or more additional grid lines into the uniform grid structure that align to a boundary of the one or more partitions, the inserting of the one or more additional grid lines resulting in a non-uniform grid graph;

removing one or more redundant grid lines from the non-uniform grid graph, the removing of the one or more redundant grid lines resulting in a partition-aware grid graph; and routing the integrated circuit design using the partition-aware grid-graph.

12. The method of claim 11, wherein the inserting of the one or more additional grid lines to the uniform grid structure comprises:

adding one or more horizontal grid lines in the uniform grid structure, each of the one or more horizontal grid lines being aligned with a horizontal partition boundary; and adding one or more vertical grid lines in the uniform grid structure, each of the one or more vertical grid lines being aligned with a vertical partition boundary.

13. The method of claim 12, wherein the adding of the one or more horizontal grid lines in the uniform grid structure comprises:

determining whether a horizontal partition boundary aligns with a grid line of the uniform grid structure; and responsive to a determination that the horizontal partition boundary does not align with a grid line of the uniform grid structure, creating a horizontal grid line at a location of the horizontal partition boundary.

14. The method of claim 12, wherein the adding of the one or more vertical grid lines in the uniform grid structure comprises:

determining whether a vertical partition boundary aligns with a grid line of the uniform grid structure; and responsive to a determination that the vertical partition boundary does not align with a grid line of the uniform grid structure, creating a vertical grid line at a location of the vertical partition boundary.

15. The method of claim 11, wherein the removing of the one or more redundant grid lines from the non-uniform grid graph comprises:

determining that a grid line in the non-uniform grid graph is redundant based on a distance between a preceding grid line and a succeeding grid line.

16. The method of claim 15, wherein the grid line is identified as being redundant based on the distance between the preceding grid line and the succeeding grid line being below a predefined distance threshold.

17. The method of claim 16, wherein the predefined distance threshold is specified by a user via a graphical user interface.

18. The method of claim 11, wherein the removing of the one or more redundant grid lines from the non-uniform grid graph comprises:

removing one or more redundant horizontal grid lines from the non-uniform grid graph; and removing one or more redundant vertical grid lines from the non-uniform grid graph.

19. The method of claim 18, wherein:

the removing of the one or more redundant horizontal grid lines comprises:

determining that a first horizontal grid line is redundant based on a distance between a second and third horizontal grid line being below a predefined distance threshold, the second horizontal grid line being below the first horizontal grid line, the third horizontal grid line being above the first horizontal grid line; and the removing of the one or more redundant vertical grid lines comprises:

determining a first vertical grid line is redundant based on a distance between a second and third vertical grid line being below a predefined distance threshold, wherein the second vertical grid line is left of the first vertical grid line, wherein the third vertical grid line is right of the first vertical grid line.

20. A system comprising:

one or more processors of a machine; and a computer-readable medium storing instructions, which when executed by the machine, cause the machine to perform operations comprising:

superimposing a uniform grid structure over a design layout of an integrated circuit that includes one or more partitions, the uniform grid structure comprising a plurality of perpendicular grid lines that form a plurality of grid cells having uniform dimensions, the superimposing of the uniform grid structure over the design layout yielding a uniform grid graph;

identifying boundaries of the one or more partitions, the boundaries of the one or more partitions corresponding to one or more unrouteable regions in the integrated circuit design based on one or more routing constraints;

inserting one or more additional grid lines into the uniform grid structure that align with an identified boundary, the inserting of the one or more additional grid lines resulting in a non-uniform grid graph;

identifying a grid line from the non-uniform grid graph as a redundant grid line based on a distance between a preceding grid line and a subsequent grid line;

removing the redundant grid line from the non-uniform grid graph, the removing of the redundant grid line resulting in a partition-aware grid graph; and routing the integrated circuit design using the partition-aware grid graph.

\* \* \* \* \*